US008923713B2

(12) United States Patent
Terao et al.

(10) Patent No.: US 8,923,713 B2
(45) Date of Patent: Dec. 30, 2014

(54) IMAGE FORMING APPARATUS, IMAGE FORMING METHOD, AND IMAGE FORMING PROGRAM

(75) Inventors: Masakazu Terao, Kanagawa (JP); Shinya Kobayashi, Kanagawa (JP); Tadashi Kasai, Kanagawa (JP); Yoshihiro Sonohara, Kanagawa (JP); Yoichi Sakurai, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 261 days.

(21) Appl. No.: 13/548,735

(22) Filed: Jul. 13, 2012

(65) Prior Publication Data

US 2013/0028620 A1 Jan. 31, 2013

(30) Foreign Application Priority Data

Jul. 25, 2011 (JP) ................................ 2011-161831

(51) Int. Cl.
*G03G 15/16* (2006.01)
*G03G 15/01* (2006.01)

(52) U.S. Cl.
CPC .......... *G03G 15/0189* (2013.01); *G03G 15/161* (2013.01); *G03G 15/1605* (2013.01); *G03F 15/6585* (2013.01)
USPC ............................................................ 399/46

(58) Field of Classification Search
USPC ........................................... 399/46, 296, 223
See application file for complete search history.

(56) References Cited

U.S. PATENT DOCUMENTS

2007/0172260 A1* 7/2007 Fukuda et al. ................ 399/223
2010/0067925 A1 3/2010 Mori
2011/0206429 A1 8/2011 Terao et al.
2011/0223527 A1 9/2011 Iio et al.
2012/0082829 A1 4/2012 Iio et al.
2012/0105915 A1 5/2012 Kobayashi et al.
2012/0107004 A1 5/2012 Sonohara et al.
2012/0134696 A1 5/2012 Kobayashi et al.

FOREIGN PATENT DOCUMENTS

CN 1206141 A 1/1999
JP 9-200551 7/1997
JP 2000-321830 A 11/2000
JP 3818498 B2 9/2006
JP 2009-63744 3/2009

OTHER PUBLICATIONS

U.S. Appl. No. 13/548,655, filed Jul. 13, 2012, Terao, et al.
Office Action issued Jul. 23, 2014 in Chinese Patent Application No. 201210245687.6.

* cited by examiner

*Primary Examiner* — Quana M Grainger
(74) *Attorney, Agent, or Firm* — Oblon, Spivak, McClelland, Maier & Neustadt, L.L.P.

(57) ABSTRACT

An image forming apparatus and method that compute a total amount of toner to be deposited per unit area of a target image in which a first unit area is computed to form a first toner image using a highest total amount of toner, and a second unit area is computed to form a second toner image using a lowest total amount of toner. When the highest total amount of toner computed by a computing unit exceeds a given level, a transfer bias determination unit identifies a transfer bias to transfer a toner image of the target image from an overlapping portion that can effectively transfer the first toner image, and the second toner image.

16 Claims, 12 Drawing Sheets

FIG. 4

TRANSFER BIAS MANAGEMENT TABLE

| TOTAL AMOUNT (%) | MINIMUM TRANSFER BIAS (μA) | MAXIMUM TRANSFER BIAS (μA) |
|---|---|---|
| ... | ... | ... |
| 100 | 40 | 70 |
| ... | ... | ... |
| 200 | 60 | 100 |
| ... | ... | ... |

FIG. 5

HEATER OUTPUT MANAGEMENT TABLE

| TOTAL AMOUNT (%) | MINIMUM OUTPUT (°C) | MAXIMUM OUTPUT (°C) |
|---|---|---|
| ... | ... | ... |
| 260 | 135 | 160 |
| ... | ... | ... |
| 360 | 145 | 160 |
| ... | ... | ... |

IMAGE FORMING APPARATUS, IMAGE FORMING METHOD, AND IMAGE FORMING PROGRAM

CROSS-REFERENCE TO RELATED APPLICATION

This application claims priority to Japanese Patent Application No. 2011-161831, filed on Jul. 25, 2011 in the Japan Patent Office, which is incorporated by reference herein in its entirety.

BACKGROUND

1. Technical Field

The present invention relates to an image forming apparatus, in which a toner image formed on a transfer member, based on image data, is transferred and fused on a recording medium to form an image.

2. Description of the Background Art

In electrophotographic image forming apparatuses, toner images are formed on a transfer belt using image data, and then transferred and fused on a sheet to form images. Such image forming apparatuses can form images using colored toner such as yellow, magenta, cyan, and black toner, and also clear toner. For example, an image forming apparatus can form images having a watermark on the top layer of the images by superimposing a toner image of clear toner over the toner images of colored toner, and transferring and fusing each of toner images on a sheet.

Compared to a color image formation using only the colored toner, when an image is formed using the colored toner and the clear toner, the total amount of toner to form the image becomes great. However, in image forming apparatuses using electrophotography, if the total amount of toner formed on the transfer belt using the becomes great, a transfer bias set for the normal transfer process may not be enough for transferring the toner image from the transfer belt to a sheet, and resultantly a transfer failure may occur.

In light of such problem, JP-2009-63744-A discloses an image forming method of an image forming apparatus, in which an upper limit (or control value) is set for the total amount of toner of colored toner and clear toner. When the total amount of toner exceeds the upper limit, the density or concentration of colored toner is adjusted. In such a method, when the total amount of toner exceeds the upper limit, the density or concentration of clear toner is fixed to a given value, and the density or concentration of colored toner is decreased to limit the total amount of toner at the upper limit. With such a configuration, an image can be formed without changing gloss appearance, which is an effect of the clear toner. However, such toner-amount reduction of the colored toner undesirably decreases image density of the resultant output image.

SUMMARY

In one aspect of the present invention, an image forming apparatus including a computing unit, a transfer bias determination unit, an image forming unit, a transfer unit, and a fusing unit is devised. The computing unit, using a processor, computes a total amount of toner to be deposited per unit area of a target image to be formed based on image data, in which a first unit area is computed to form a first toner image using a highest total amount of toner, and a second unit area is computed to form a second toner image using a lowest total amount of toner. The transfer bias determination unit that, using the processor, determines, when the highest total amount of toner computed by the computing unit exceeds a given level, whether a first transfer bias range enabling transfer of the computed highest total amount of toner and a second transfer bias range enabling transfer of the computed lowest total amount of toner have an overlapping portion that can effectively transfer the first toner image, and the second toner image. The transfer bias determination unit determines a transfer bias to transfer a toner image of the target image from the overlapping portion that can effectively transfer the first toner image, and the second toner image. The image forming unit forms the toner image of the target image on a transfer member by forming the first toner image, and the second toner image. The transfer unit transfers the toner image of target image, formed on the transfer member, to a recording medium using the transfer bias determined by the transfer bias determination unit. The fusing unit fuses the toner image of target image, transferred by the transfer unit, on the recording medium.

In another aspect of the present invention, an image forming method is devised. The method includes the steps of: computing a total amount of toner to be deposited per unit area of a target image to be formed based on image data, in which a first unit area is computed to form a first toner image using a highest total amount of toner, and a second unit area is computed to form a second toner image using a lowest total amount of toner; when the highest total amount of toner computed by the computing step exceeds a given level, determining whether a first transfer bias range enabling transfer of the computed highest total amount of toner, and a second transfer bias range enabling transfer of the computed lowest total amount of toner have an overlapping portion that can effectively transfer the first toner image, and the second toner image; identifying a transfer bias to transfer a toner image of the target image from the overlapping portion that can effectively transfer the first toner image, and the second toner image; forming the toner image of the target image on a transfer member by forming the first toner image, and the second toner image on the transfer member; transferring the toner image of target image, formed on the transfer member, to a recording medium using the determined transfer bias; and fusing the toner image of target image, transferred by the transfer step, on the recording medium.

In another aspect of the present invention, a non-transitory computer readable storage medium storing a program that, when executed by a computer, causes the computer to execute a method of image forming processing in an image forming apparatus, is devised. The method includes the steps of: computing a total amount of toner to be deposited per unit area of a target image to be formed based on image data, in which a first unit area is computed to form a first toner image using a highest total amount of toner, and a second unit area is computed to form a second toner image using a lowest total amount of toner; when the highest total amount of toner computed by the computing step exceeds a given level, determining whether a first transfer bias range enabling transfer of the computed highest total amount of toner, and a second transfer bias range enabling transfer of the computed lowest total amount of toner have an overlapping portion that can effectively transfer the first toner image, and the second toner image; identifying a transfer bias to transfer a toner image of the target image from the overlapping portion that can effectively transfer the first toner image, and the second toner image; forming the toner image of the target image on a transfer member by forming the first toner image, and the second toner image on the transfer member; transferring the toner image of target image, formed on the transfer member, to a recording medium using the determined transfer bias; and fusing the toner image of target image, transferred by the transfer step, on the recording medium.

BRIEF DESCRIPTION OF THE DRAWINGS

A more complete appreciation of the disclosure and many of the attendant advantages and features thereof can be readily obtained and understood from the following detailed description with reference to the accompanying drawings, wherein:

FIG. 4 is an example of a transfer bias management table;

FIG. 5 is an example of a heater output management table;

Figure 1:
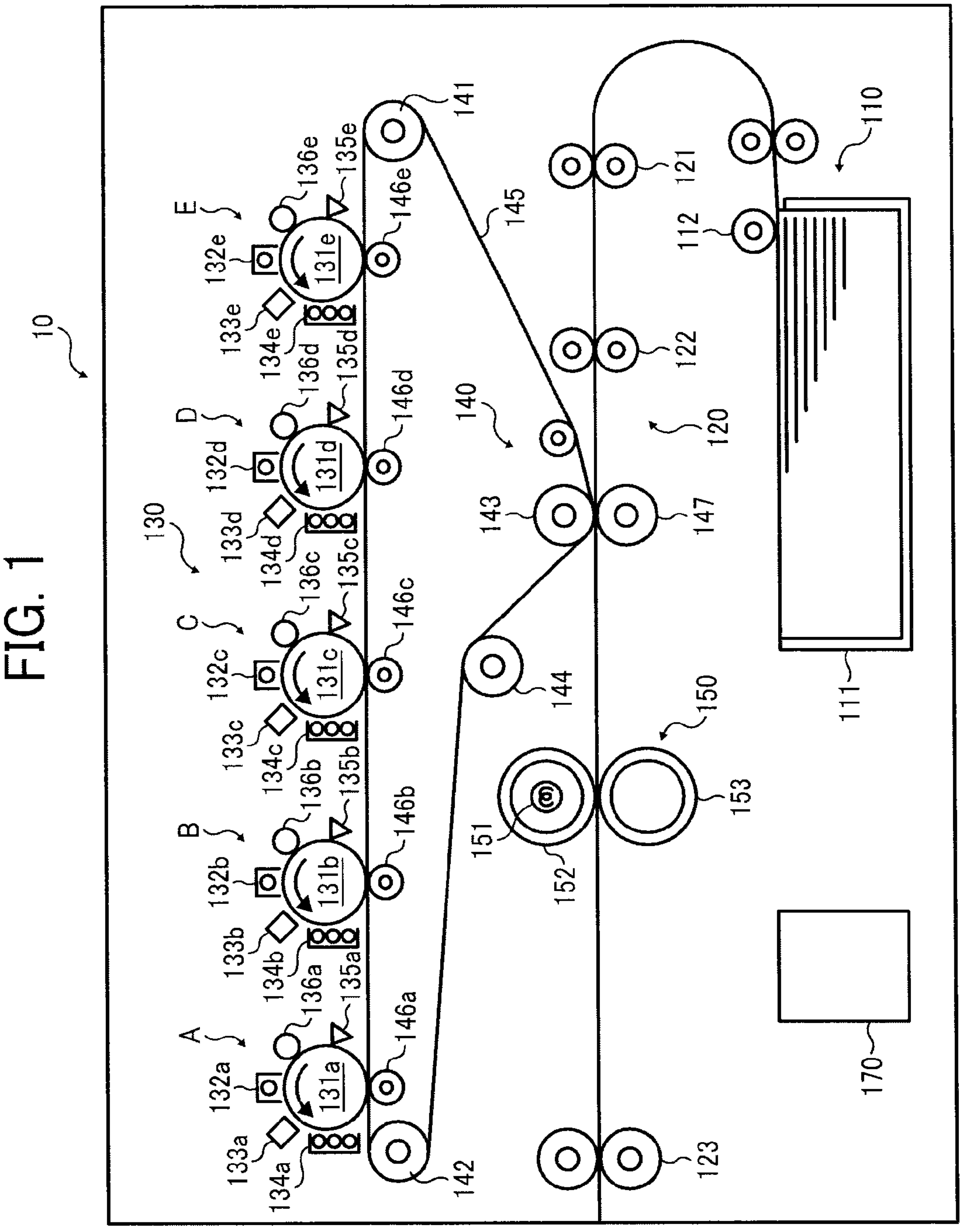
FIG. 1 shows a schematic configuration of an image forming apparatus according to a first example embodiment.

The accompanying drawings are intended to depict exemplary embodiments of the present invention and should not be interpreted to limit the scope thereof. The accompanying drawings are not to be considered as drawn to scale unless explicitly noted, and identical or similar reference numerals designate identical or similar components throughout the several views.

DETAILED DESCRIPTION OF EXEMPLARY EMBODIMENTS

A description is now given of exemplary embodiments of the present invention. It should be noted that although such terms as first, second, etc. may be used herein to describe various elements, components, regions, layers and/or sections, it should be understood that such elements, components, regions, layers and/or sections are not limited thereby because such terms are relative, that is, used only to distinguish one element, component, region, layer or section from another region, layer or section. Thus, for example, a first element, component, region, layer or section discussed below could be termed a second element, component, region, layer or section without departing from the teachings of the present invention.

In addition, it should be noted that the terminology used herein is for the purpose of describing particular embodiments only and is not intended to be limiting of the present invention. Thus, for example, as used herein, the singular forms "a", "an" and "the" are intended to include the plural forms as well, unless the context clearly indicates otherwise. Moreover, the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Furthermore, although in describing views shown in the drawings, specific terminology is employed for the sake of clarity, the present disclosure is not limited to the specific terminology so selected and it is to be understood that each specific element includes all technical equivalents that operate in a similar manner and achieve a similar result. Referring now to the drawings, an apparatus or system according to example embodiments are described hereinafter.

First Example Embodiment

A description is given of a first example embodiment of the present invention with referring to the drawings. FIG. 1 shows a schematic configuration of an image forming apparatus 10 according to a first example embodiment. The image forming apparatus 10 can form images by fusing toner images on recording media such as sheets like paper.

As shown in FIG. 1, the image forming apparatus 10 may include a sheet feed unit 110, a transport unit 120, an image forming unit 130, a transfer unit 140, a fusing unit 150, and a control unit 170.

As shown in FIG. 1, the sheet feed unit 110 may include a sheet container 111, and a sheet feed roller 112. The sheet container 111 contains sheets to be fed. The sheet feed roller 112 is used to feed the sheets contained in the sheet container 111 one by one.

The transport unit 120 may include a transport roller 121, a timing roller 122, and an ejection roller 123. The transport roller 121 transports a sheet fed from the sheet feed roller 112 toward the transfer unit 140. The timing roller 122, which is a pair of rollers, stops the sheet transported from the transport roller 121 by sandwiching the front edge of sheet for a given time, and then feeds the sheet to the transfer unit 140 at a given timing. The ejection roller 123 ejects the sheet fused with toner at the fusing unit 150 from a transport route in the image forming apparatus 10. Further, the transport unit 120 may include a guide member to guide the transported sheets along the transport route.

The image forming unit 130 may include image forming devices A, B, C, D, and E disposed with each other with a given interval as shown in FIG. 1. For example, the image forming device A uses a developer of clear toner. The image forming device B uses a developer of yellow toner (one of colored toners). The image forming device C uses a developer of cyan toner (one of colored toners). The image forming device D uses a developer of magenta toner (one of colored toners). The image forming device E uses a developer of black toner (one of colored toners).

The image forming devices A, B, C, D, and E shown in FIG. 1 employ a substantially same mechanical configuration except the types of developers used for each image forming device. Each of the image forming units may include photoconductor drums 131*a*, 131*b*, 131*c*, 131*d*, 131*e*, chargers 132*a*, 132*b*, 132*c*, 132*d*, 132*e*, exposures 133*a*, 133*b*, 133*c*, 133*d*, 133*e*, developing units 134*a*, 134*b*, 134*c*, 134*d*, 134*e*, dechargers 135*a*, 135*b*, 135*c*, 135*d*, 135*e*, and cleaners 136*a*, 136*b*, 136*c*, 136*d*, 136*e*, respectively.

The photoconductor drums 31*a*, 131*b*, 131*c*, 131*d*, 131*e* may rotate in the counter-clockwise direction, to which latent images and toner images can be formed. The chargers 132*a*, 132*b*, 132*c*, 132*d*, 132*e* respectively charge the surface of the photoconductor drums 131*a*, 131*b*, 131*c*, 131*d*, 131*e* uniformly. The exposures 133*a*, 133*b*, 133*c*, 133*d*, 133*e* respectively expose the surface of the photoconductor drums 131*a*, 131*b*, 131*c*, 131*d*, 131*e* charged by the chargers 132*a*, 132*b*, 132*c*, 132*d*, 132*e* based on image data to form a latent image. The developing units 134*a*, 134*b*, 134*c*, 134*d*, 134*e* respectively develop the latent image formed on the surface of the photoconductor drums 131*a*, 131*b*, 131*c*, 131*d*, 131*e* by the exposures 133*a*, 133*b*, 133*c*, 133*d*, 133*e* as a toner image, wherein the developing unit may be a magnetic brush type unit. The dechargers 135*a*, 135*b*, 135*c*, 135*d*, 135*e* respectively decharge the surface of the photoconductor drums 131*a*, 131*b*, 131*c*, 131*d*, 131*e* after the toner image is primary transferred to a transfer member or medium such as a transfer belt or the like. The cleaners 136*a*, 136*b*, 136*c*, 136*d*, 136*e* respectively removes toner remaining on the surface of the photoconductor drums 131*a*, 131*b*, 131*c*, 131*d*, 131*e* after decharging by the dechargers 135*a*, 135*b*, 135*c*, 135*d*, 135*e*.

For the simplicity of expression, the photoconductor drums 131*a*, 131*b*, 131*c*, 131*d*, 131*e* may be referred to as the photoconductor drum 131. The chargers 132*a*, 132*b*, 132*c*, 132*d*, 132*e* may be referred to as the charger 132. The exposures 133*a*, 133*b*, 133*c*, 133*d*, 133*e* may be referred to as the exposure 133. The developing units 134*a*, 134*b*, 134*c*, 134*d*, 134*e* may be referred to as the development unit 134. The dechargers 135*a*, 135*b*, 135*c*, 135*d*, 135*e* may be referred to as the decharger 135. The cleaners 136*a*, 136*b*, 136*c*, 136*d*, 136*e* may be referred to as the cleaner 136.

The transfer unit 140 may include a drive roller 141, a driven roller 142, a secondary counter roller 143, a tension roller 144, and an intermediate transfer belt 145. The secondary counter roller 143 is disposed downward of rollers 141 and 142. The tension roller 144 is disposed between the driven roller 142 and the secondary counter roller 143. The intermediate transfer belt 145, extended by such rollers, may rotate in the clockwise direction by driving the drive roller 141.

Further, the transfer unit 140 may include primary transfer rollers 146*a*, 146*b*, 146*c*, 146*d*, 146*e*. The primary transfer rollers 146*a*, 146*b*, 146*c*, 146*d*, 146*e*, disposed at the belt portion extended by the drive roller 141 and the driven roller 142, face the photoconductor drum 131 via the intermediate transfer belt 145. The primary transfer rollers 146*a*, 146*b*, 146*c*, 146*d*, 146*e* may be referred to as the primary transfer roller 146.

The intermediate transfer belt 145 is sequentially transferred with each toner image formed on each of the photoconductor drums 131 when a primary transfer voltage is applied by each of the primary transfer rollers 146.

Further, the transfer unit 140 may include a secondary transfer roller 147. The secondary transfer roller 147 faces the secondary counter roller 143 via the intermediate transfer belt 145. With such a configuration, the toner image transferred on the intermediate transfer belt 145 is transferred to a sheet, being transported between the secondary transfer roller 147 and the intermediate transfer belt 145, by applying a secondary transfer bias having a voltage and a current to the sheet by the secondary transfer roller 147.

The fusing unit 150 may include a heat roller 152 having a heater 151 therein, and a pressure roller 153. The heat roller 152 heats a sheet at a temperature higher than the lower limit of toner fuse-able temperature. The heat roller 152 and the pressure roller 153 form a nip, or a contactable portion, therebetween by pressing the pressure roller 153 to the heat roller 152 while the pressure roller 153 and the heat roller 152 are rotatable. In the first example embodiment, toner can be fused effectively between the lower limit of toner fuse-able temperature and the upper limit of toner fuse-able temperature.

The control unit 170 controls the image forming apparatus 10 as a whole. The control unit 170 may include a central processing unit (CPU), and a storage such as a read only memory (ROM), and a random access memory (RAM), or the like for controlling the image forming apparatus 10.

Figure 2:
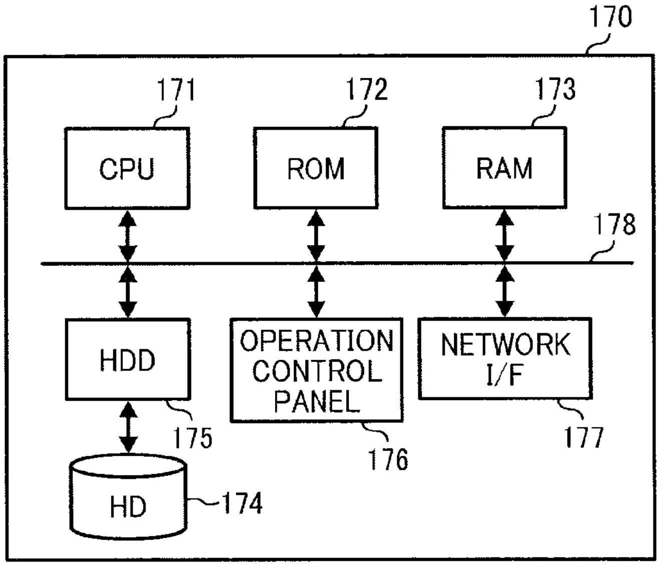
FIG. 2 shows a hardware configuration of the image forming apparatus of FIG. 1.

A description is given of a hardware configuration of the control unit 170 of the image forming apparatus 10 with reference to FIG. 2. The control unit 170 may include a CPU 171, a ROM 172, a RAM 173, a hard disk (HD) 174, a hard disk drive (HDD) 175, an operation control panel 176, a network interface (I/F) 177, and a bus line 178.

The CPU 171 controls the image forming apparatus 10 as a whole. The ROM 172 stores programs such as an image forming program for the image forming apparatus 10 to implement various functions and units of the image forming apparatus 10. The RAM 173 can be used as a working area or memory of the CPU 171. The HD 174 stores various data. The HDD 175 controls reading and writing of various data to the HD 174 under the control of the CPU 171. The operation control panel 176 may include a display panel to display operation status of the image forming apparatus 10, and to receive an input by a user. The network I/F 177 conducts data communication with external devices or apparatuses such as image forming apparatuses. The bus line 178 is used to connect the above mentioned units electrically as shown in FIG. 2, and can be used, for example, as an address bus and a data bus.

The developer may be one-component developer having toner, or two-component developer having toner and carrier. The toner may be colored toner such as yellow, cyan, magenta, and black toner, and also clear toner.

The colored toner may mean resin particles having coloring agent such as pigment, dye, or the like, and having a given charging level. Further, the clear toner may mean resin particles which may be substantially colorless. When the clear toner is fused, the surface of recording media and/or images formed on the recording media can be seen through the clear toner. Therefore, the clear toner can include some amount of coloring agent such as fluorescent pigment, color pigment, or the like as long as the surface of recording media can be seen after the fusing of clear toner.

Figure 3:
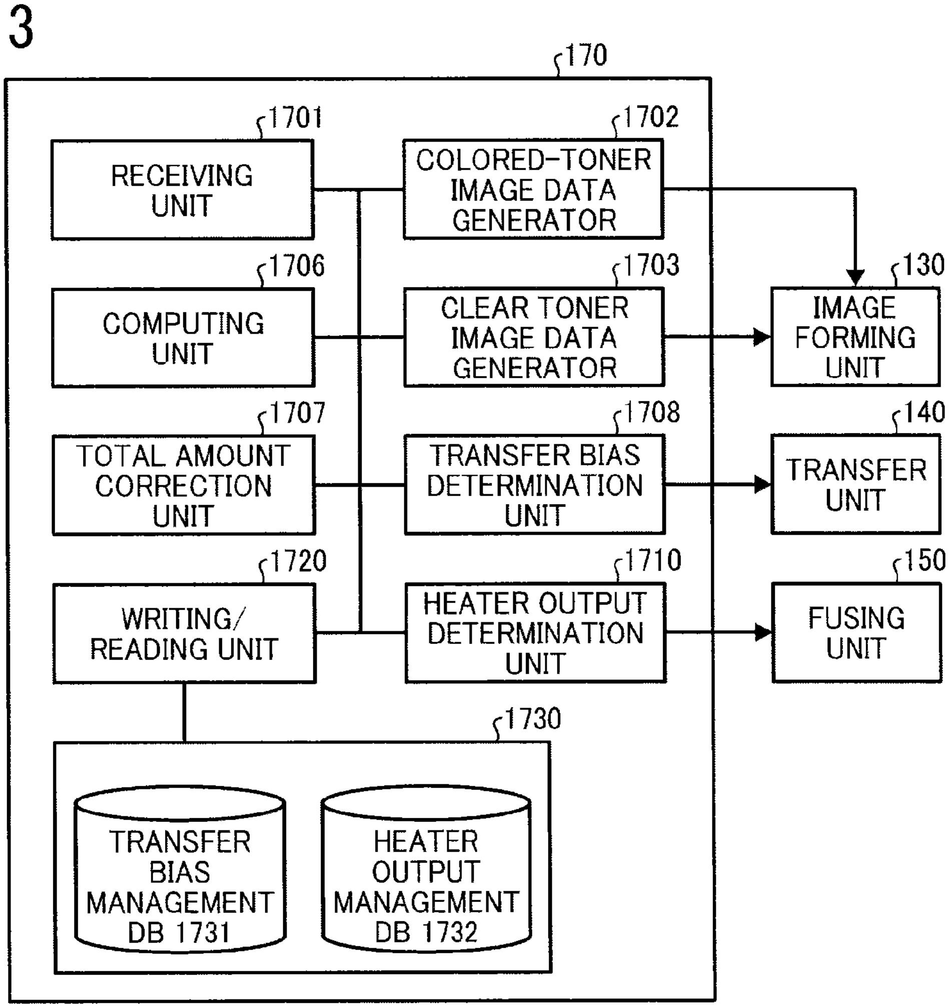
FIG. 3 is a functional block diagram of the image forming apparatus of FIG. 1.
Figure 6A:
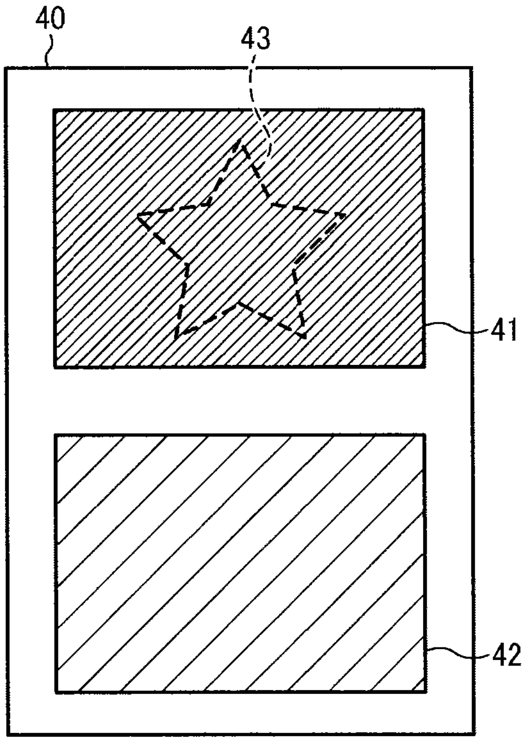
FIG. 6A is an example of image formed by the image forming apparatus of FIG. 1.
Figure 6B:
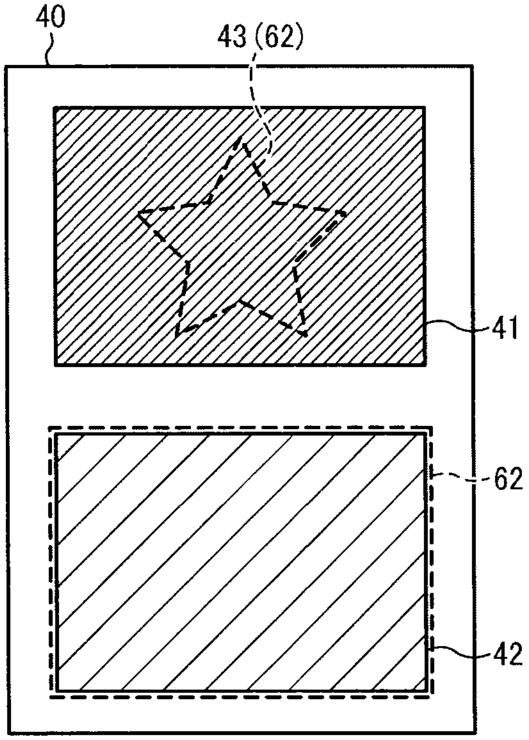
FIG. 6B shows a detail of the image of FIG. 6A.
Figure 8A:
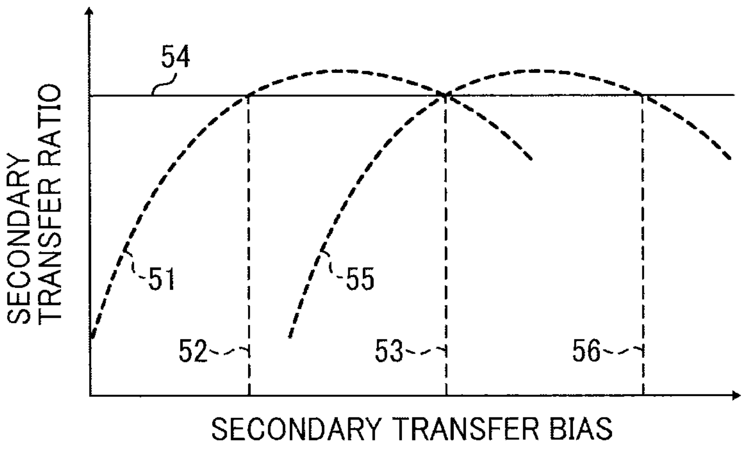
FIG. 8A shows an example of correlation diagram of a secondary transfer bias and a secondary transfer ratio.

A description is given of functional configuration of the first example embodiment with reference to FIGS. 3, 4, 5, 6A, 6B and 8A. FIG. 3 is a functional block diagram of the image forming apparatus 10 according to the first example embodiment. FIG. 4 is an example of a transfer bias management table. FIG. 5 is an example of a heater output management table. FIGS. 6A and 6B shows an example of image formable by the image forming apparatus 10. FIG. 8A shows an example of correlation diagram of a secondary transfer bias and a secondary transfer ratio.

As for the image forming apparatus 10, as shown in FIG. 3, the control unit 170 may include a receiving unit 1701, a colored toner image data generator 1702, a clear toner image data generator 1703, a computing unit 1706, a total amount correction unit 1707, a transfer bias determination unit 1708, a heater output determination unit 1710, and a writing/reading unit 1720. These units or functions can be devised when each units shown in FIG. 2 is operated by instructions of the CPU 171 by executing programs stored in the ROM 172. Further, the control unit 170 may include a storage unit 1730 configured by, for example, the HD 174 shown in FIG. 2.

(Transfer Bias Management Table)

The storage unit 1730 may configure a transfer bias management database (DB) 1731, which may include a transfer bias management table shown in FIG. 4. The transfer bias management DB 1731 may be referred to as the transfer bias manager. The transfer bias management table stores and manages information of secondary transfer bias variably set in view of the total amount of toner for forming toner images using colored toners, and clear toner. Specifically, information of a secondary transfer bias range that can transfer a toner image formed on the intermediate transfer belt 145 to a sheet can be defined by setting a given range for secondary transfer bias such as setting a minimum value and a maximum value for the secondary transfer bias. Such minimum and maximum values vary depending on the total amount of toner to be deposited at each one of unit areas (e.g., pixel) of one target image, which is to be formed as a toner image using colored toners, and clear toner, as required. For example, as shown in the transfer bias management table of FIG. 4, a secondary transfer bias range that can transfer a toner image formed by using the total toner amount of 100% is, for example, set from 40 μA (microamperes) to 70 μA.

A description is given of a relationship of a secondary transfer bias and a secondary transfer ratio with reference to FIG. 8A. The secondary transfer ratio is a value obtained by dividing the mass of toner transferred from a transfer belt to a recording medium by the mass of toner adhering on the transfer belt before transferring the toner to the recording medium.

In FIG. 8A, a profile 51 shows an example of correlation of a secondary transfer bias and a secondary transfer ratio when the image forming apparatus 10 transfers toner images formed by using the lowest total amount (e.g., total amount of 1%), wherein the lowest total amount is the lowest amount of toner that the image forming apparatus 10 can transfer when forming toner images.

Further, the total amount of toner is an amount of toner used for forming a toner image on each one of unit areas of one target image, to be formed based on image data, in which each toner (e.g., colored toner, clear toner) is used with a specific amount (referred to as sub-amount), and the total amount of toner is obtained by adding the sub-amount of each toner (e.g., colored toner, clear toner) used for a relevant image. The total amount of toner can be computed for each one of unit areas (e.g., pixel) composing one target image. The sub-amount indicates the amount of toner such as mass of toner, volume of toner, amount of toner particles, ratio of toner, or the like used for each unit area (e.g., pixel). The sub-amount may be parameters expressed by such as mass of toner, thickness of toner, volume of toner, types of toner color, and gradient, in which the gradient may be used because the gradient can be computed relatively easily. Such parameters can be correlated with each other. Experiments can be conducted to determine preferable values for such parameters based on measurement results obtained by the experiments, and then, suitable relationship between parameters can be set, and one parameter can be converted another parameter effectively.

In the case of the profile 51, when the secondary transfer bias is lower than a current value 52, charges that can be used for transferring toner become small, and thereby the secondary transfer ratio may not reach a transfer ratio 54, which is a minimum-required level for the transfer process. The transfer ratio 54 is a transfer ratio, which can conduct a transfer process at an acceptable level, which may be determined in view of image forming conditions designed for each apparatus.

By contrast, when the secondary transfer bias is greater than the current value 53, charged toner may move to the intermediate transfer belt 145, and thereby the secondary transfer ratio may not reach the transfer ratio 54. Therefore, in the case of the profile 51, a secondary transfer bias range that can effectively transfer toner images is from the current value 52 to the current value 53.

In FIG. 8A, a profile 55 shows an example of correlation of a secondary transfer bias and a secondary transfer ratio, set for transfer process of toner image formed by using a toner-amount control value (e.g., total amount of toner of 260%). The toner-amount control value may be the highest total amount of toner to be deposited at one-pixel area that an image forming operations can be conducted effectively. In the case of the profile 55, a secondary transfer bias range that can effectively transfer toner images is from the current value 53 to the current value 56. Compared to a case in which the total amount of toner is small, when the total amount of toner becomes great, the charge amount held by toner formed on the intermediate transfer belt 145 increases, shifting a secondary transfer bias range that can transfer a toner image toward a high current.

As for the image forming apparatus 10, the default or initial value set for the secondary transfer bias may be set to the current value 53. By setting the current value 53 as the default or initial value set for the secondary transfer bias, the image forming apparatus 10 can transfer toner images with the transfer ratio 54 or more for toner image formed by the lowest total amount (e.g., 1%) to toner image formed by the toner-amount control value (e.g., 260%).

If a secondary transfer bias range that can transfer toner images to sheets changes due to factors such as toner type, sheet type, sheet size, print speed of the image forming apparatus 10, or the like, the transfer bias management table can be prepared in view of each condition (e.g., sheet type).

(Heater Output Management Table)

The storage unit 1730 may further configure a heater output management database (DB) 1732, which may include a heater output management table shown in FIG. 5. The heater output management DB 1732 may be referred to as the heating amount manager. The heater output management table stores and manages heater output information such as heating amount to be applied for fusing toner images on sheets. Specifically, heater output range (e.g., heating amount) of the heater 151 (i.e., minimum to maximum values), which is a heating amount that can effectively fuse toner images on sheets, can be variably set depending on the total amount of toner to be deposited at each one of unit areas (e.g., pixel) of one target image, which is to be formed as a toner image using colored toners, and clear toner, as required. For example, as shown in the heater output management table of FIG. 5, a heater output range (e.g., temperature used for fusing process) that can apply heat amount enabling fusing of a toner image formed by the total amount of 260% to sheets is, for example, from 135 Celsius degrees to 160 Celsius degrees.

The minimum value of heater output is set in view of cold off-set. If the heater output such as heat amount is low, toner may not be effectively melted at a boundary with a sheet, by which a part of toner image may be removed to a fusing roller such as a heat roller during the fusing process (i.e., cold off-set). Therefore, the minimum value of heater output is set to a level that does not cause the cold off-set. Further, the maximum value of heater output is set in view of hot off-set. If the heater output such as heat amount is high, a part of toner image may be removed and adhered to a fusing roller such as a heat roller during the fusing process (i.e., hot off-set). Therefore, the maximum value of heater output is set to a level that does not cause the hot off-set. The greater the total amount of toner, the greater the minimum value and maximum value of heater output because the greater the total amount of toner, the greater the heat amount required to heat toner.

If a secondary transfer bias range that can transfer toner images to sheets changes due to factors such as toner type, sheet type, sheet size, print speed of the image forming apparatus 10, or the like, the heater output management table can be prepared in view of each condition (e.g., sheet type).

The receiving unit 1701 may be devised using the network I/F 177 shown in FIG. 2. The receiving unit 1701 receives various data or information transmitted from a terminal or device used as an image outputting apparatus, via a communication network. The received data may include image data of image to be formed by the colored toner, and gloss area information indicating a gloss area to be formed by using the clear toner.

The image data may be RGB image data obtained by decomposing an image to, for example, R (Red), G (Green), and B (Blue) image data. In the first example embodiment, as shown in FIGS. 6A and 6B, an image corresponding to the image data may include a high image density area 41 and a low image density area 42. The high image density area 41 may be, for example, a color image area having high image density, and the low image density area 42 may be, for example, a grayscale image area having low image density.

The gloss area information may be positional information indicating an area used for causing a gloss effect in a target image. In the first example embodiment, as shown in FIGS. 6A and 6B, a gloss area 43 indicated in the gloss area information may be formed on or over the high image density area 41. With such a configuration, a watermark can be set by using the effect of gloss level difference between the gloss area 43 and the high image density area 41. The gloss area 43 can be formed by placing a clear toner on an image (see toner 62 in FIG. 9).

The colored toner image data generator 1702 generates image data such as color image data of an image to be formed by the colored toner based on the image data received by the receiving unit 1701, in which the CPU 171 executes a program stored in the ROM 172, and issues an instruction to the colored toner image data generator 1702 to conduct such data generation. For example, based on the RGB image data, the colored toner image data generator 1702 generates the color image data (e.g., C, M, Y, K image data) of an image to be formed by using colored toner of cyan (C), magenta (M), yellow (Y), and black (K).

The clear toner image data generator 1703 generates image data (i.e., clear image data) of a clear toner image, to be formed by using the clear toner based on the gloss area information received by the receiving unit 1701, in which the CPU 171 executes a program stored in the ROM 172, and issues an instruction to the clear toner image data generator 1703 to conduct such data generation.

Based on the image data of the target image to be formed by each colored toner and clear toner, the computing unit 1706 computes the total amount of toner for each one of unit areas (e.g., pixel) composing the target image, in which the CPU 171 executes a program stored in the ROM 172, and issues an instruction to the computing unit 1706 to conduct such computing.

The computing unit 1706 computes the total amount of toner deposited at each unit area (e.g., pixel), composing the target image, by adding gradient (%) of decomposed color data such as C, M, Y, K image data generated by the colored toner image data generator 1702, and gradient (%) of the clear image data generated by the clear toner image data generator 1703. The unit area may be one pixel, or a given area composed of a plurality of pixels. In the first example embodiment, the unit area may be one-pixel area but not limited to these.

The total amount correction unit 1707 may correct the total amount of toner by increasing an amount of clear toner at a relevant unit area, in which the CPU 171 executes a program stored in the ROM 172, and issues an instruction to the total amount correction unit 1707 to conduct such correction.

The transfer bias determination unit 1708 determines a secondary transfer bias to be applied by the secondary transfer roller 147 of the transfer unit 140 for the secondary transfer process of toner image, in which the CPU 171 executes a program stored in the ROM 172, and issues an instruction to the transfer bias determination unit 1708 to conduct such determination.

The heater output determination unit 1710 sets a heater output of the heater 151 of the fusing unit 150, in which the CPU 171 executes a program stored in the ROM 172, and issues an instruction to the heater output determination unit 1710 to set such heater output.

The writing/reading unit 1720 stores various data to the storage unit 1730, and reads out various data stored in the storage unit 1730 under an instruction of the CPU 171 (FIG. 2) and the HDD 175 (FIG. 2).

Figure 7:
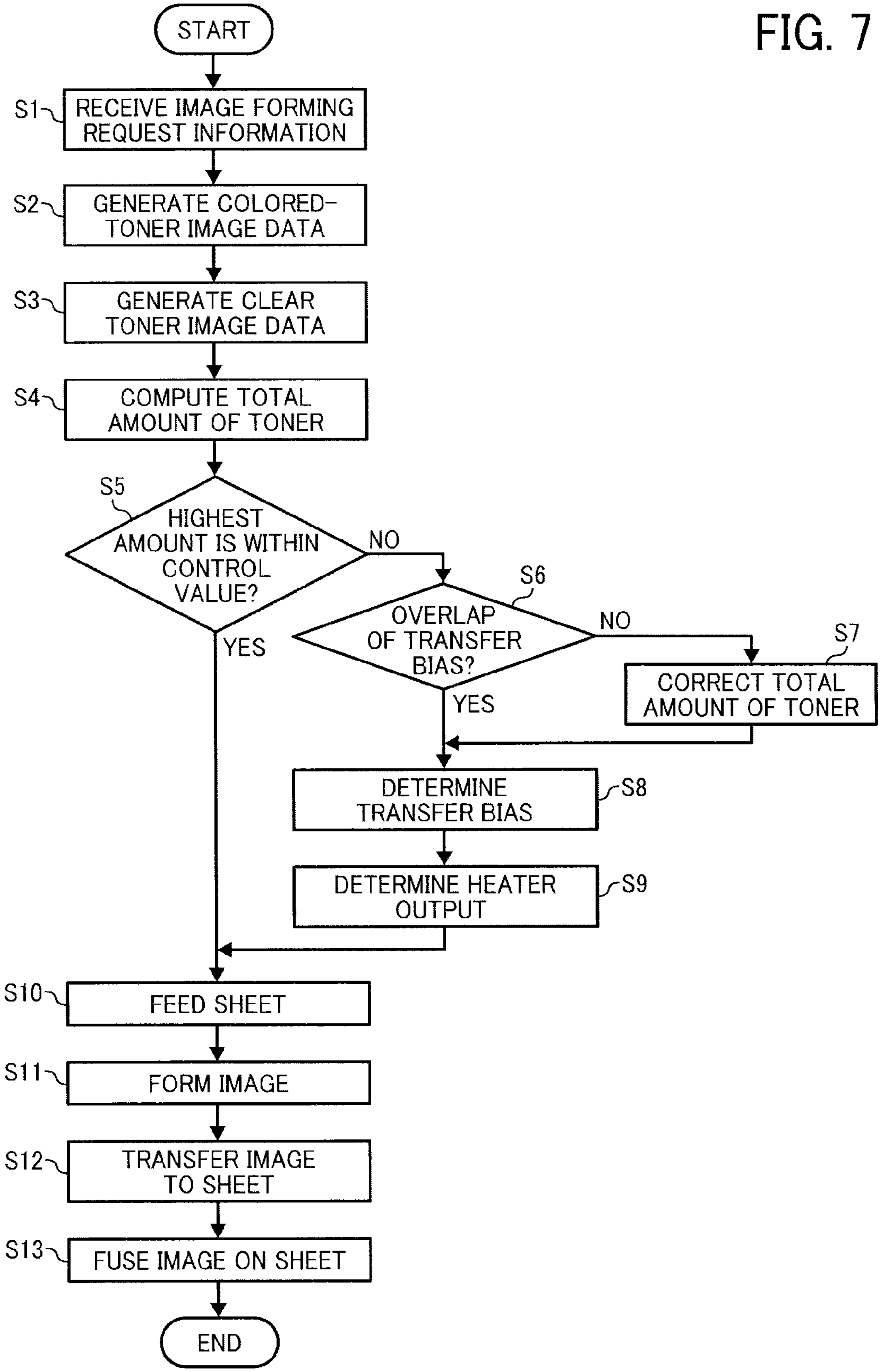
FIG. 7 shows a flowchart of a process executable by the image forming apparatus of FIG. 1.
Figure 8B:
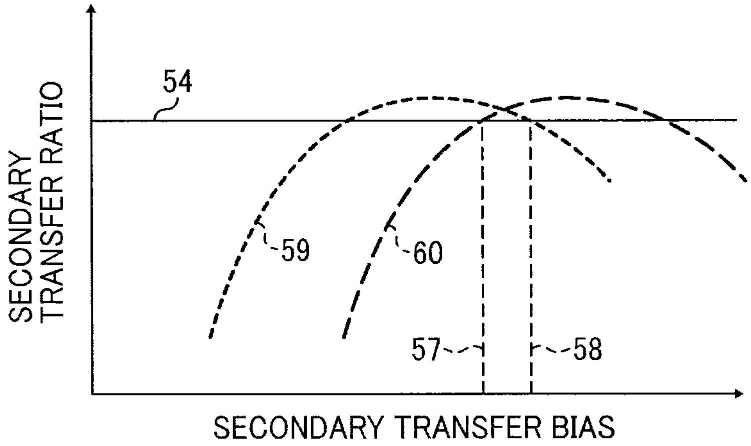
FIG. 8B shows another correlation diagram of a secondary transfer bias and a secondary transfer ratio.
Figure 8C:
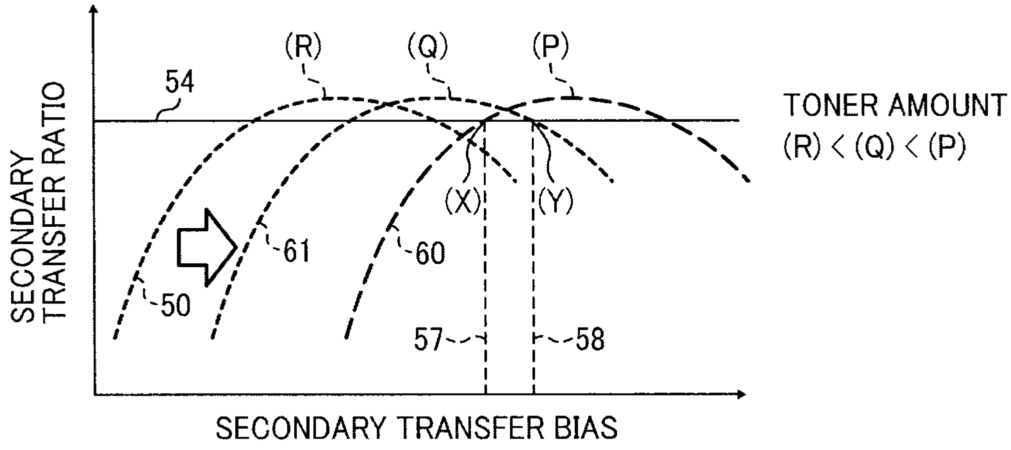
FIG. 8C shows another correlation diagram of a secondary transfer bias and a secondary transfer ratio.
Figure 9:
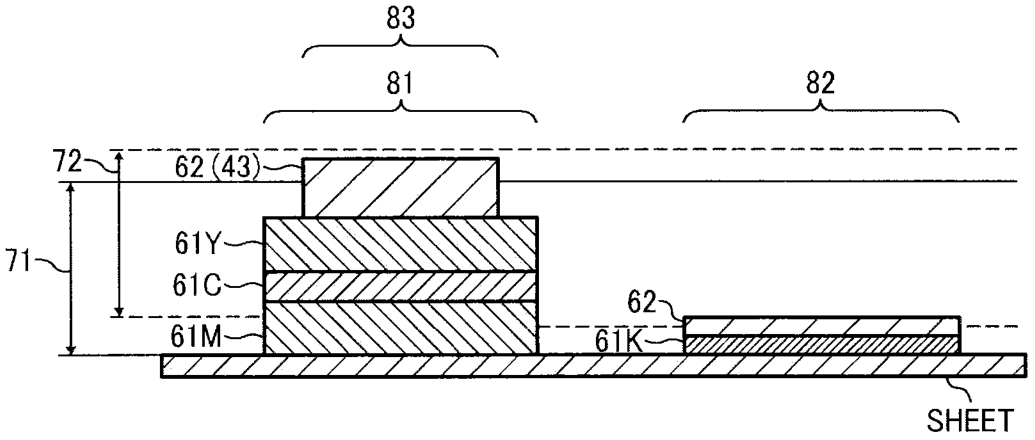
FIG. 9 shows a schematic cross-sectional view of toner images transferred on a sheet with one image forming pattern.
Figure 10:
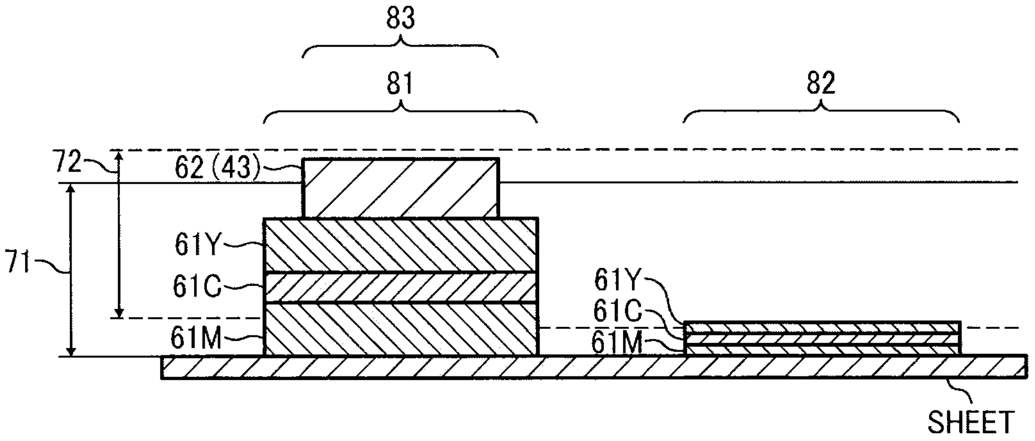
FIG. 10 shows a schematic cross-sectional view of toner images transferred on a sheet with another image forming pattern.

A description is given of a process executable in the image forming apparatus 10 with reference to FIGS. 6A, 6B, 7, 8B, 8C, 9, and 10. FIGS. 6A and 6B show an example of image formed by the image forming apparatus 10. FIG. 7 shows a flowchart of a process executable in the image forming apparatus 10. FIGS. 8B and 8C show examples of correlation diagrams of the secondary transfer bias and the secondary transfer ratio. FIGS. 9 and 10 show schematic cross sectional views of toner images transferred on sheets.

As shown in FIG. 7, the receiving unit 1701 of the image forming apparatus 10 receives image forming request information including image data, and gloss area information (step S1). The image data and the gloss area information may be transmitted from an image output terminal such as an information processing apparatus via a communication network. In the first example embodiment, image data may be RGB image data.

When the receiving unit 1701 receives the image forming request information (step S1), the colored toner image data generator 1702 generates image data such as C, M, Y, K image data used for forming an image composed of colored toner of cyan (C), magenta (M), yellow (Y), and black (K) based on the RGB image data included in the image forming request information (step S2).

The colored toner image data generator 1702 conducts a color conversion process for the RGB image data corresponding to the high image density area 41 (e.g., color image) and the low image density area 42 (e.g., grayscale image) (FIGS. 6A and 6B), included the image forming request information, and generates C, M, Y, K image data corresponding to the decomposed color data for each colored toner of C, M, Y, and K. Further, other than the color conversion process of image data, the colored toner image data generator 1702 can conduct image processing such as a color correction process, a space frequency correction process, or the like.

In contrast, the clear toner image data generator 1703 generates image data (i.e., clear image data) used for forming an image of clear toner (CL) based on the gloss area information included in the image forming request information (step S3). In the first example embodiment, the clear toner image data generator 1703 generates the clear image data corresponding to the gloss area 43 to be set on the high image density area 41 shown in FIGS. 6A and 6B.

Then, the computing unit 1706 computes the total amount of toner to be deposited for each one of unit areas (e.g., each pixel) composing a target image when a toner image is to be formed by colored toner such as cyan (C), magenta (M), yellow (Y), and black (K), and clear toner (CL) (step S4). The computing unit 1706 computes the total amount of toner to be used for forming a toner image for each one of unit areas (e.g., pixel) by adding gradient (%) of decomposed color data such as C, M, Y, K image data generated by the colored toner image data generator 1702, and gradient (%) of the clear image data generated by the clear toner image data generator 1703.

As such, at step S4, in view of the to-be-formed toner image, the computing unit 1706 computes the total amount of toner to be deposited at each pixel, which are unit areas of the target image. Such toner image may be composed of different patterns such as an image area (e.g., photo, picture, graph), a text area (e.g., letter), a background area (e.g., background pattern, sheet face), or the like. Therefore, each one of the pixels may be deposited with different amount of toner. For example, in one target image composed of multiple pixels, a small amount of toner may be deposited at one pixel and a large amount of toner may be deposited at another pixel. In such target image, at least one pixel is deposited with a lowest amount of toner (i.e., lowest total amount of toner) compared to other pixels, and at least one pixel is deposited with a highest amount of toner (i.e., highest total amount of toner) compared to other pixels. Based on such computed result, step S5 is conducted as follows. It should be noted that a total amount of toner to be deposited per unit area of a target image, to be formed based on image data, can be computed as follows: a first unit area is computed to form a first toner image using a highest total amount of toner, and a second unit area is computed to form a second toner image using a lowest total amount of toner. As such, a toner image of target image may be composed of a plurality of toner images using different total amount of toner per unit area.

The total amount correction unit 1707 determines whether the highest total amount of toner to be disposed at one pixel, computed by the computing unit 1706, is within a given level such as the toner-amount control value (step S5). The ROM 172 of the image forming apparatus 10 may store the toner-amount control value. With such a configuration, the total amount correction unit 1707 can determine whether the highest total amount of toner is within the toner-amount control value by referencing the toner-amount control value stored in the ROM 172.

If it is determined that the highest total amount of toner is not within the toner-amount control value (step S5: NO), the total amount correction unit 1707 determines whether a secondary transfer bias range that can transfer a toner image having the highest total amount of toner, computed by the computing unit 1706, and a secondary transfer bias range that can transfer a toner image having the lowest total amount of toner, computed by the computing unit 1706, overlap with each other (step S6).

At step S6, the total amount correction unit 1707 searches the transfer bias management table (FIG. 4) using the computed lowest total amount of toner as a search key, and obtains a maximum transfer bias corresponding to the computed lowest total amount of toner. For example, if the computed lowest total amount of toner is 100%, the corresponding maximum transfer bias becomes 70 μA (FIG. 4). Further, the total amount correction unit 1707 searches the transfer bias management table (FIG. 4) using the computed highest total amount of toner as a search key, and obtains a minimum transfer bias corresponding to the computed highest total amount of toner. For example, if the computed highest total amount of toner is 200%, the corresponding minimum transfer bias becomes 60 μA (FIG. 4).

When the maximum transfer bias corresponding to the lowest total amount of toner is same or greater than the minimum transfer bias corresponding to the highest total amount of toner, the total amount correction unit 1707 determines that two secondary transfer bias profiles have an overlapping portion with each other in view of the effective secondary transfer ratio (e.g., profiles 59 and 60 of FIG. 8B).

When the maximum transfer bias corresponding to the lowest total amount of toner is smaller than the minimum transfer bias corresponding to the highest total amount of toner in view of the effective secondary transfer ratio, the total amount correction unit 1707 determines that the two secondary transfer bias profiles do not have an overlapping portion with each other (e.g., profiles 50 and 60 of FIG. 8C).

If it is determined that the two secondary transfer bias profiles do not have an overlapping portion with each other (step S6: NO), the total amount correction unit 1707 corrects the total amount of toner by increasing an amount of clear toner at a relevant pixel (step S7). At step S7, the total amount correction unit 1707 corrects the total amount of toner at the relevant pixel to a value so that a transfer bias range that can transfer a toner image formed by the lowest total amount of toner (i.e., corrected lowest total amount of toner) at one-pixel area, and a transfer bias range that can transfer a toner image formed by the highest total amount of toner at one-pixel area overlap with each other in view of the effective secondary transfer ratio.

The total amount correction unit 1707 searches the transfer bias management table (FIG. 4) using the computed highest total amount (e.g., P in FIG. 8C) of toner as the search key, and obtains a minimum transfer bias (e.g., X in FIG. 8C) corresponding to the computed highest total amount (P). Then, the total amount correction unit 1707 searches a total amount of toner having a maximum transfer bias (e.g., Yin FIG. 8C) greater than the obtained minimum transfer bias (X) by referencing the transfer bias management table (FIG. 4). Specifically, the total amount of toner having the maximum transfer bias greater than the obtained minimum transfer bias (X) may be set for a plurality of levels in the transfer bias management table. From the plurality of levels of the total amount of toner, the total amount correction unit 1707 searches a lowest total amount of toner (e.g., Q in FIG. 8C) having a maximum transfer bias (Y) greater than the obtained minimum transfer bias (X) by referencing the transfer bias management table.

Further, in the image data used for an image forming operation, an image data having a total amount of toner (e.g., R in FIG. 8C), which is smaller than the obtained total amount of toner (Q), may exist. The total amount correction unit 1707 corrects the image data having the total amount of toner (R) by increasing an amount of clear toner for the relevant pixel. Specifically, the total amount correction unit 1707 corrects the total amount of toner (R) to the total amount of toner (Q)

for the relevant pixel so that the total amount of toner (R) becomes the total amount of toner (Q) (e.g., profile 50 for R and profile 61 for Q in FIG. 8C). Based on the corrected total amount of toner (Q), the clear image data is corrected and transmitted to the image forming unit 130, and such corrected clear image data is used to generate a toner image of clear toner.

If it is determined that the two secondary transfer bias profiles overlap with each other (step S6: YES), or the total amount correction is conducted (step S7), the transfer bias determination unit 1708 determines the secondary transfer bias (step S8). With such a configuration, the default or initial value set for the secondary transfer bias can be corrected to a new secondary transfer bias.

The transfer bias determination unit 1708 refers to the transfer bias management table (FIG. 4), and as shown in FIG. 8B for example, determines the secondary transfer bias in a range from the transfer bias 57 (i.e., minimum transfer bias for the highest total amount of toner) to the transfer bias 58 (i.e., maximum transfer bias for the lowest total amount of toner). Further, when the total amount correction (step S7) is conducted, the maximum transfer bias for the lowest total amount of toner, corresponding to the corrected toner amount used for forming the relevant image, becomes the maximum transfer bias (e.g., 58 in FIG. 8C) for the lowest total amount of toner (Q) which is set by conducting the total amount correction.

After conducting the transfer bias determination process (step S8), the heater output determination unit 1710 determines a heater output of the heater 151 (step S9). With such a configuration, the default or initial value of the heater output of the heater 151 may be corrected to a new heater output, as required.

In this situation, the heater output determination unit 1710 searches the heater output management table (FIG. 5), and determines a heater output of the heater 151 in a range from a minimum heater output for the highest total amount of toner to a maximum heater output corresponding to the lowest total amount of toner. When the total amount correction (step S7) is conducted, the maximum heater output corresponding to the lowest total amount of toner becomes a maximum heater output corresponding to the lowest total amount of toner which is set by conducting the total amount correction.

If it is determined that the highest total amount of toner is within the toner-amount control value (step S5: YES), or the heater output adjustment process is executed (step S9), the sheet feed roller 112 of the sheet feed unit 110 feeds sheets contained in the sheet container 111 one by one to a transport route in the image forming apparatus 10 (step S10). Then, the transport roller 121 of the transport unit 120 transports the sheet to the transfer unit 140. The timing roller 122 sandwiches the front edge of the sheet transported by the transport roller 121, and stops the sheet until a transfer timing of image to the sheet at the transfer unit 140.

The image forming devices of the image forming unit 130 form toner images composed of toner images of C, M, Y, K, and CL based on the generated color image data, and clear image data (step S11), in which the charger 132 uniformly charges the surface of the photoconductor drum 131 rotating in the counter-clockwise direction.

The exposure 133 irradiates a light beam onto the charged surface of the photoconductor drum 133 charged by the charger 132 based on each image data to form a latent image. The exposure 133*a* emits a laser beam onto the charged surface of the photoconductor drum 133*a* based on the clear image data. With such a configuration, an electrostatic latent image corresponding to the clear image data is formed on the charged photoconductor drum 131*a*.

Similarly, each of the exposures 133*b*, 133*c*, 133*d*, 133*e* emits a laser beam onto the charged surface of the photoconductor drums 131*b*, 131*c*, 131*d*, 131*e* based on color image data such as decomposed color data included in C, M, Y, K image data. With such a configuration, electrostatic latent images corresponding to each of the decomposed color data of Y, C, M, K is formed on the each of the charged photoconductor drums 131*b*, 131*c*, 131*d*, 131*e*, respectively.

When each electrostatic latent image is formed, the development unit 134 develops the electrostatic latent image on the photoconductor drums 131*a*, 131*b*, 131*c*, 131*d*, 131*e* using toner CL, Y, C, M, K to form toner images of CL, Y, C, M, K.

The developed toner images are sequentially and superimposingly transferred onto the intermediate transfer belt 145 traveling in the clockwise direction in FIG. 1 by applying a primary transfer voltage using the primary transfer roller 146 (primary transfer process).

A description is given of toner images transferred on a sheet with reference to FIG. 9. As shown in FIG. 9, a toner image 81 is formed by yellow toner (toner 61Y), cyan toner (toner 61C), and magenta toner (toner 61M) on a sheet, wherein the toner image 81 corresponds to the high image density area 41 of FIG. 6B. Further, as shown in FIG. 9, clear toner 62 is placed on the toner image 81 to form a toner image 83, which corresponds to the gloss area 43 of FIG. 6B. In FIG. 9, the toner image 81 is, for example, composed of the toner 61Y, toner 61C, and toner 61M, and the toner image 83 is, for example, composed of the toner 61Y, toner 61C, toner 61M, and the clear toner 62.

Further, another toner image is formed on a sheet using black toner (toner 61K) and placing the clear toner 62 on the toner 61K, which may correspond to the low image density area 42 of FIG. 6B. Specifically, based on the corrected clear image data, the clear toner 62 is formed on the toner 61K to form a toner image corresponding to the low image density area 42 of FIG. 6B.

After the primary transfer of toner images to the intermediate transfer belt 145, the surface of the photoconductor drum 131 is neutralized by the decharger 135. Further, toner remaining on the neutralized surface of the photoconductor drum 131 is removed by the cleaner 136.

The toner image transferred and adhered to the intermediate transfer belt 145 travels with the intermediate transfer belt 145. When the determined secondary transfer bias is applied by the secondary transfer roller 147, the toner image is transferred to a sheet (step S12), which is the secondary transfer process.

When the transfer bias determination process is conducted, the secondary transfer bias determined by the transfer bias determination unit 1708 (step S8) is used as the secondary transfer bias. Further, the sheet to be transferred with the toner image can be fed by the timing roller 122 at a timing that the toner image on the intermediate transfer belt 145 comes to the nip of secondary transfer process.

In the first example embodiment, as shown in FIG. 9, a toner image, formed by depositing toner particles up to an designed toner amount range 71, corresponding to the toner-amount control value, can be formed effectively by using the default or initial value set for the secondary transfer bias. However, as shown in FIG. 9, a part of the toner image 83 exceeds the designed toner amount range 71. Therefore, if a secondary transfer process for the toner image 83 is conducted using the default or initial value set for the secondary transfer bias, charges that can be used for the transfer process of toner becomes relatively small, and thereby a transfer failure may occur at an area of the toner image 83. Such unpreferable transfer phenomenon may correspond to the relation of the profiles 60 and 50 in FIG. 8C, in which the profiles 60 and 50 have no overlapping portion or range for effective transfer process.

In such a situation, the total amount correction unit 1707 corrects the total amount of toner for the low image density area 42 by increasing an amount of the clear toner 62 used for the low image density area 42. Further, the transfer bias determination unit 1708 determines the secondary transfer bias in a range from the minimum transfer bias (e.g., 57 in FIG. 8C) corresponding to the highest total amount of toner to the maximum transfer bias (e.g., 58 in FIG. 8C corresponding to the lowest total amount of toner (step S8).

With such a configuration, the lowest total amount of toner for the relevant pixel is increased, and thereby the amount difference between the lowest total amount of toner for the relevant pixel and the highest total amount of toner for another relevant pixel can be shifted to an adjusted toner amount range 72 (FIG. 9), in which the maximum amount of toner can be maintained at high, which may be required to form an image having a given color tone. With such adjustment, the toner image 81, the toner image 82, and the toner image 83 can be effectively transferred by the determined secondary transfer bias.

The sheet having received the secondary transfer processing is then transported to the fusing unit 150. The sheet transported to the fusing unit 150 is heated and pressurized by the heat roller 152 and the pressure roller 153 when the sheet passes a nip set between the heat roller 152 and the pressure roller 153 (step S13). When the heater output adjustment process is executed, the heater output of the heater 151 of the heat roller 152 is set to a heater output determined by the heater output determination unit 1710 (step S9). When the heater output adjustment process is not conducted, the heater output of the heater 151 is set to the default or initial value of heater output.

With such a configuration, the toners of CL, C, M, Y, K transferred to the sheet can be plasticized or melted. Further, by applying pressure to the melted toner and sheet by the pressure roller 153, the toner can be closely adhered to the sheet, and toner may intrude to fibers of sheet, by which the toner fuses on the sheet. Because the heater output adjustment process is executed (step S9), the cold off-set does not occur to the toner image 82 having a small total amount of toner, and the hot off-set does not occur to the toner image 83 having a great total amount of toner.

Then, the sheet is ejected by the ejection roller 123 from the transport route in the image forming apparatus 10, and stacked on a given receiver container such as a tray.

(Another Processing for First Example Embodiment)

In the above described configuration, the total amount correction unit 1707 of the control unit 170 of the image forming apparatus 10 corrects the total amount of toner by increasing an amount of clear toner. However, the correction of the total amount of toner is not limited the above described method. For example, the total amount correction unit 1707 can correct the total amount of toner for the relevant pixel by increasing the numbers or types of colored toner. Thus, for example, the total amount correction unit 1707 instructs the colored toner image data generator 1702 to convert RGB image data for the low image density area 42 (e.g., grayscale image) to C, M, Y image data corresponding to toner 61C, 61M, 61Y instead of K image data corresponding to toner 61K. As such, black image data can be prepared using C, M, Y image data.

In such a case, the amount of toner 61C, 61M, 61Y of the toner image 82 (FIG. 10) formed at the low image density area 42 becomes great compared to the amount of toner 61K forming a black image (FIG. 9) using only single color (i.e., black only).

With such a configuration, the correction amount corrected by the clear toner can be reduced, and thereby the change of gloss level of the toner image 82 due to the toner amount correction can be reduced (FIG. 10).

In the above described example embodiment, the ROM 172 of the control unit 170 of the image forming apparatus 10 may store programs used for image forming apparatus. However, programs can be stored differently. For example, an image output terminal used as one example of image forming apparatuses may include a storage unit to store image forming programs, which are programs used for image forming apparatus. With such a configuration, a part or entire of functions of the control unit 170 may be devised by the image output terminal. In such a case, the image output terminal can transmit image data having corrected total amount of toner, transfer bias information indicating the secondary transfer bias, information of the heater output of the heater 151 to the image forming apparatus 10. Further, the image forming apparatus 10 can form images based on the transmitted data and information.

In the above described example embodiment, the heating amount can be defined by the heater output of the heater 151 such as specific temperature set for the fusing process. However, the heating amount indicating a heating level can be defined differently. For example, instead of the temperature information set for the heater 151, the heating time by the heater 151 can be used as the heating amount.

(Effect of First Example Embodiment)

In the first example embodiment, the computing unit 1706 of the control unit 170 of the image forming apparatus 10 computes the total amount of toner for each one of unit areas (e.g., pixel) based on image data. When the computed highest total amount of toner to be deposited at one-pixel area exceeds the toner-amount control value, the transfer bias determination unit 1708 refers to the transfer bias management table (FIG. 4) to determine the secondary transfer bias in the range from the minimum transfer bias (e.g., 57 in FIG. 8B) for the highest total amount of toner at one-pixel area to the maximum transfer bias (e.g., 58 in FIG. 8B) for the lowest total amount of toner at one-pixel area.

The secondary transfer roller 147 transfers toner images formed on a transfer belt to a sheet using a transfer bias, wherein the transfer bias can be set by determining whether a transfer bias range that can transfer a toner image formed by the highest total amount of toner at one-pixel area, and a transfer bias range that can transfer a toner image formed by the lowest total amount of toner at one-pixel area overlap with each other, and then setting a transfer bias selected from an overlapping portion of two ranges or profiles of transfer bias range.

With such a configuration, even when the total amount of toner at one-pixel area exceeds the toner-amount control value, by using a transfer bias determined by the above described process, toner images can be transferred without reducing the toner amount for the target or main image, by which the decrease of image density of the target or main image caused by the reduction of toner amount can be prevented.

Further, in the first example embodiment, when the two transfer bias profiles do not overlap (step S6: NO), the total amount correction unit 1707 conducts the total amount correction process by increasing the toner amount to be used for forming a toner image. In such a case, the total amount correction unit 1707 refers to the transfer bias management table (FIG. 4) to increase the toner amount to a value so that a transfer bias range that can transfer a toner image formed by the highest lowest amount of toner for one pixel, and a transfer bias range that can transfer a toner image formed by the highest total amount of toner for one pixel can overlap with other.

With such a configuration, the secondary transfer roller 147 can use the overlapping portion or range or portion of the secondary transfer bias profiles effectively, determined by the transfer bias determination unit 1708, to transfer a toner image.

Further, in the first example embodiment, the total amount correction unit 1707 can correct the total amount of toner deposited at the relevant unit area by increasing the amount of clear toner. With such a configuration, the total amount of toner deposited at the relevant unit area can be corrected while preventing a change of color tone of the target or main image.

Further, in the first example embodiment, the total amount correction unit 1707 can correct the total amount of toner deposited at the relevant unit area by increasing the numbers or types of colored toner. For example, the total amount correction unit 1707 instructs the colored toner image data generator 1702 to convert RGB image data for the low image density area 42 (e.g., grayscale image) to C, M, Y image data corresponding to toner 61C, 61M, 61Y instead of K image data corresponding to toner 61K. In such a case, the amount of toner 61C, 61M, 61Y of the toner image 82 (FIG. 10) formed at the low image density area 42 becomes great compared to the amount of toner 61K forming a black image (FIG. 9) using only single color (i.e., black only). With such a configuration, the amount of the clear toner used for the toner amount correction can be reduced, and thereby the change of gloss level of the toner image 82 due to the toner amount correction can be reduced (FIG. 10).

Further, in the image forming apparatus 10, the image forming unit 130 may form a toner image of clear toner on the intermediate transfer belt 145 before a toner image of colored toner is formed, in which the clear toner image becomes a bottom layer of the toner image formed on the intermediate transfer belt 145. With such a configuration, the clear toner image becomes a top layer of the toner image after conducting the secondary transfer process, by which the clear toner can be used as toner for forming a watermark, and also as toner for correcting the total amount of toner deposited at the relevant unit area.

Further, in the first example embodiment, the heater output determination unit 1710 searches the heater output management table (FIG. 5) to determine a heater output of the heater 151 in a range from a minimum heater output of the heater 151, corresponding to the highest total amount of toner to be deposited at one-pixel area, to a maximum heater output of the heater 151, corresponding to the lowest total amount of toner at other unit area.

The heat roller 152 heats a sheet based on a heater output of the heater 151 determined by the heater output determination unit 1710, in which the heat roller 152 heats the sheet using an overlapping heater output range of the heater 151, which is determined from a heater output range of the heater 151 that can fuse the highest total amount of toner at one-pixel area, and the heater output range of the heater 151 that can fuse the lowest total amount of toner at other unit area. Therefore, even if the total amount of toner deposited at the relevant unit area exceeds the toner-amount control value, the toner image can be fused effectively.

Second Example Embodiment

Figure 11:
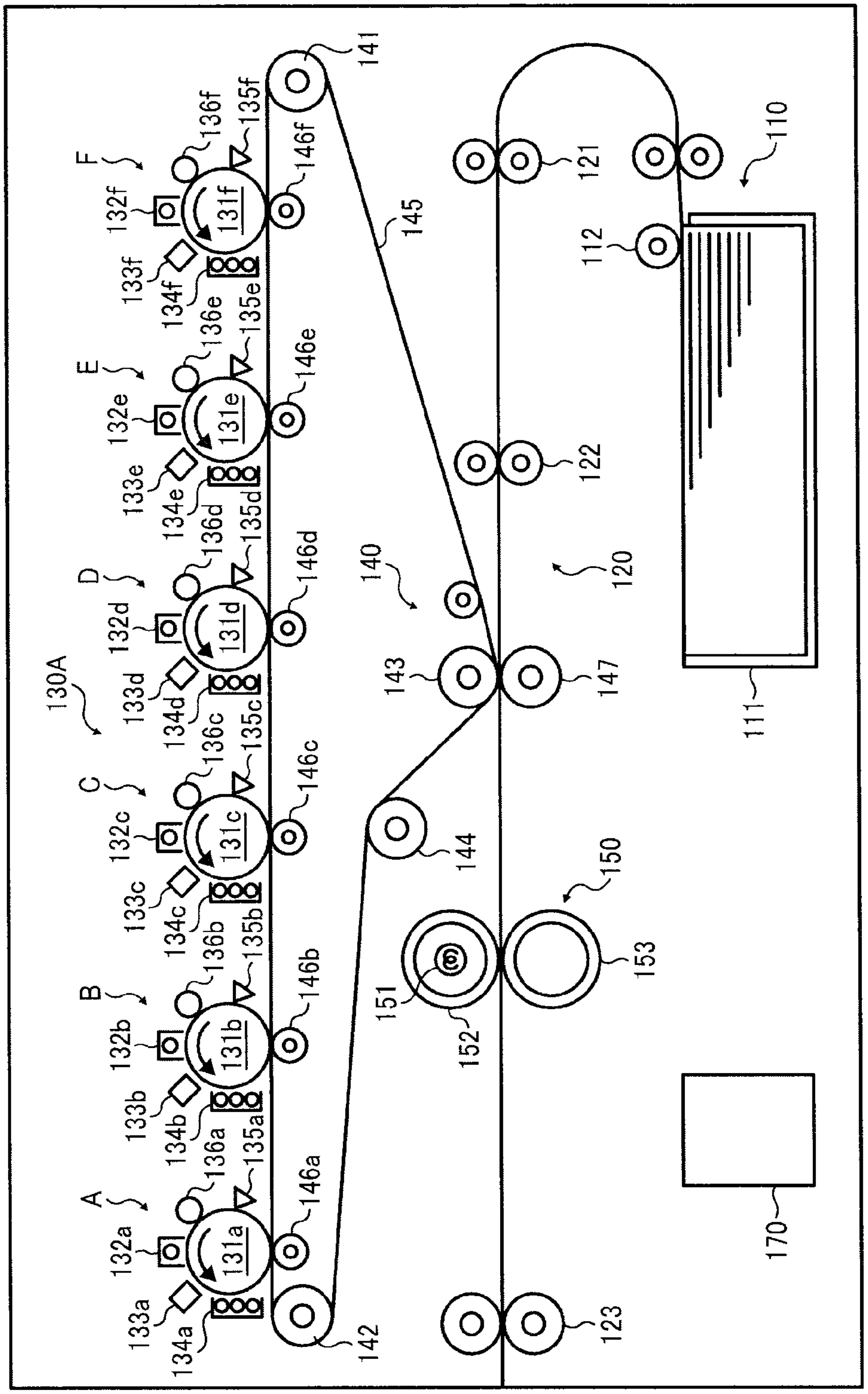
FIG. 11 shows a schematic configuration of an image forming apparatus according to a second example embodiment.

A description is given of a second example embodiment of the present invention with referring to the drawings. FIG. 11 shows a schematic configuration of an image forming apparatus 10A according to the second example embodiment of the present invention. Different from the first example embodiment, the image forming apparatus 10A according to a second example embodiment includes an image forming device F that uses a developer of surface-coating toner.

An image forming unit 130A may include image forming devices A, B, C, D, E, and F disposed with each other with a given interval as shown in FIG. 11. For example, the image forming unit A uses a developer of clear toner. The image forming device B uses a developer of yellow toner (colored toner). The image forming device C uses a developer of cyan toner (colored toner). The image forming device D uses a developer of magenta toner (colored toner). The image forming device E uses a developer of black toner (colored toner). The image forming device F uses a developer of surface-coating toner.

The image forming devices A, B, C, D, E, and F shown in FIG. 11 employ a substantially same mechanical configuration except the types of developers used for each image forming device. The image forming device F may include a photoconductor drum 131*f*, a charger 132*f*, an exposure 133*f*, a developing unit 134*f*, a decharger 135*f*, and a cleaner 136*f*. The photoconductor drum 131*f* may rotate in the counterclockwise direction, to which latent images and toner images can be formed. The charger 132*f* charges the surface of the photoconductor drum 131*f* uniformly. The exposure 133*f* exposes the surface of the photoconductor drum 131*f* charged by the charger 132*f* based on image data to form a latent image. The developing unit 134*f* develops a latent image formed on the surface of the photoconductor drum 131*f* by the exposure 133*f* as a toner image, wherein the developing unit may be a magnetic brush type unit. The decharger 135*f* decharges the surface of the photoconductor drum 131*f* after the toner image is primary transferred to a transfer member or medium. The cleaner 136*f* removes toner remaining on the surface of the photoconductor drum 131*f* after decharging by the decharger 135*f*.

For the simplicity of expression, the photoconductor drums 131*a*, 131*b*, 131*c*, 131*d*, 131*e*, 131*f* may be referred to as the photoconductor drum 131. The chargers 132*a*, 132*b*, 132*c*, 132*d*, 132*e*, 132*f* may be referred to as the charger 132. The exposures 133*a*, 133*b*, 133*c*, 133*d*, 133*e*, 133*f* may be referred to as the exposure 133. The developing units 134*a*, 134*b*, 134*c*, 134*d*, 134*e*, 134*f* may be referred to as the development unit 134. The dechargers 135*a*, 135*b*, 135*c*, 135*d*, 135*e*, 135*f* may be referred to as the decharger 135. The cleaners 136*a*, 136*b*, 136*c*, 136*d*, 136*e*, 136*f* may be referred to as the cleaner 136.

A description is given of a hardware configuration of a control unit of the image forming apparatus 10A. A control unit 170A of the image forming apparatus 10A employs a hardware configuration similar to the hardware configuration of the first example embodiment shown in FIG. 2.

The developer may be one component developer having toner, or two component developer having toner and carrier. The toner may be colored toner such as yellow, cyan, magenta, and black, clear toner, surface-coating toner. Different from the first example embodiment, the surface-coating toner is used with the colored toner and the clear toner as developer for the second example embodiment.

The surface-coating toner mean resin particles having coloring agent such as pigment, dye, or the like having same or similar color of sheets, and having a given charging level. Further, the surface-coating toner may mean resin particles that may be see-through type toner having a given charging level, wherein when such surface-coating toner is fused, the surface of recording medium can be seen through the surface-coating toner.

Figure 12:
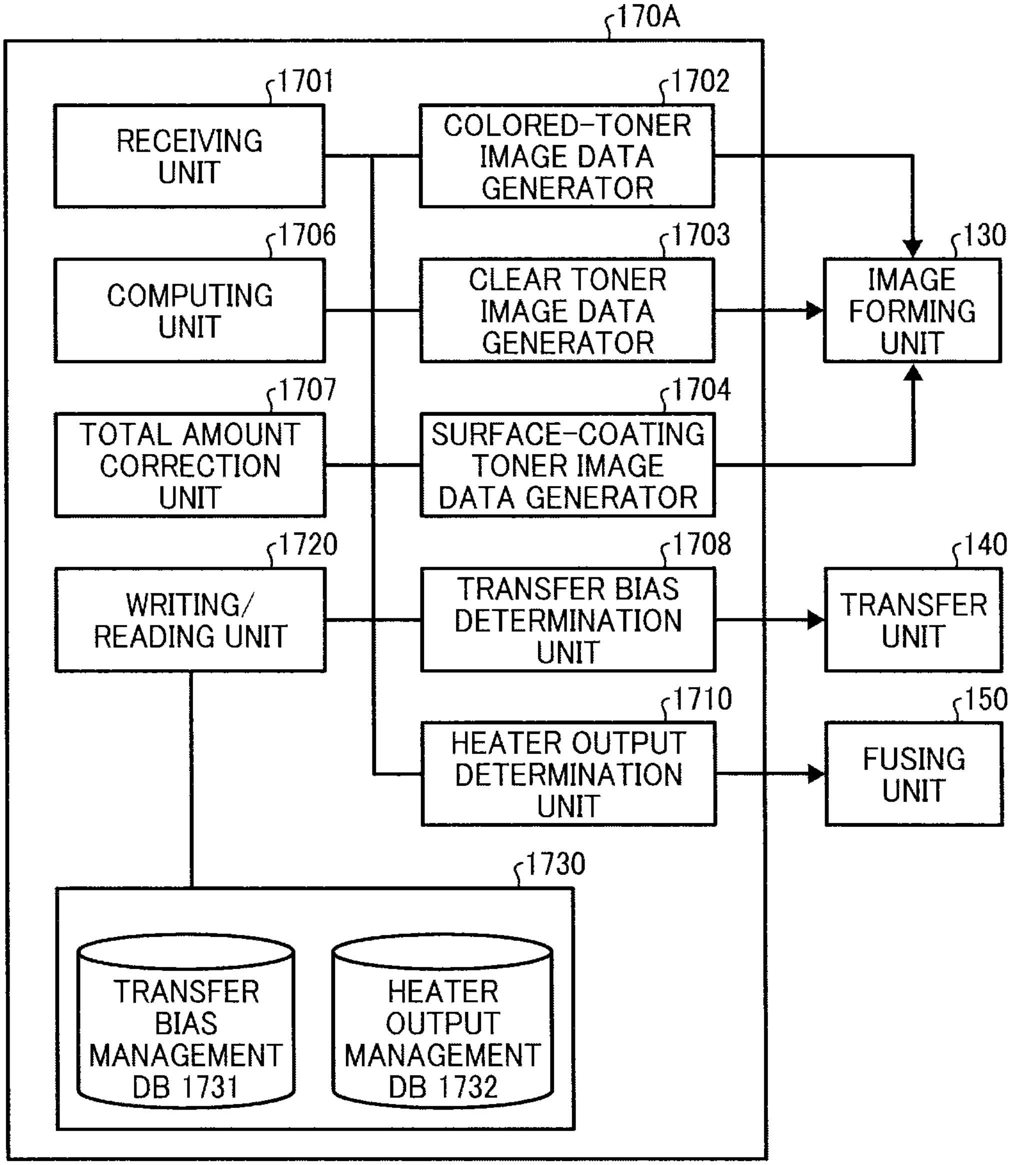
FIG. 12 is a functional block diagram of an image forming apparatus of FIG. 11.
Figure 13A:
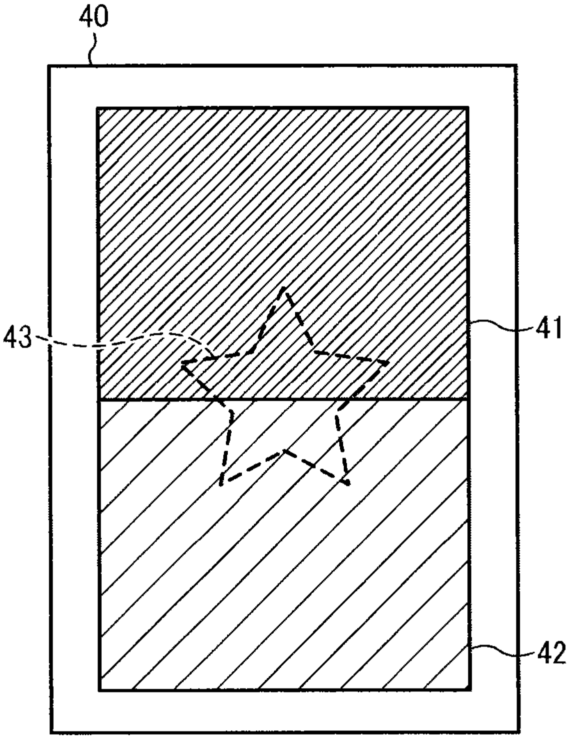
FIG. 13A is an example of image formed by the image forming apparatus of FIG. 11.
Figure 13B:
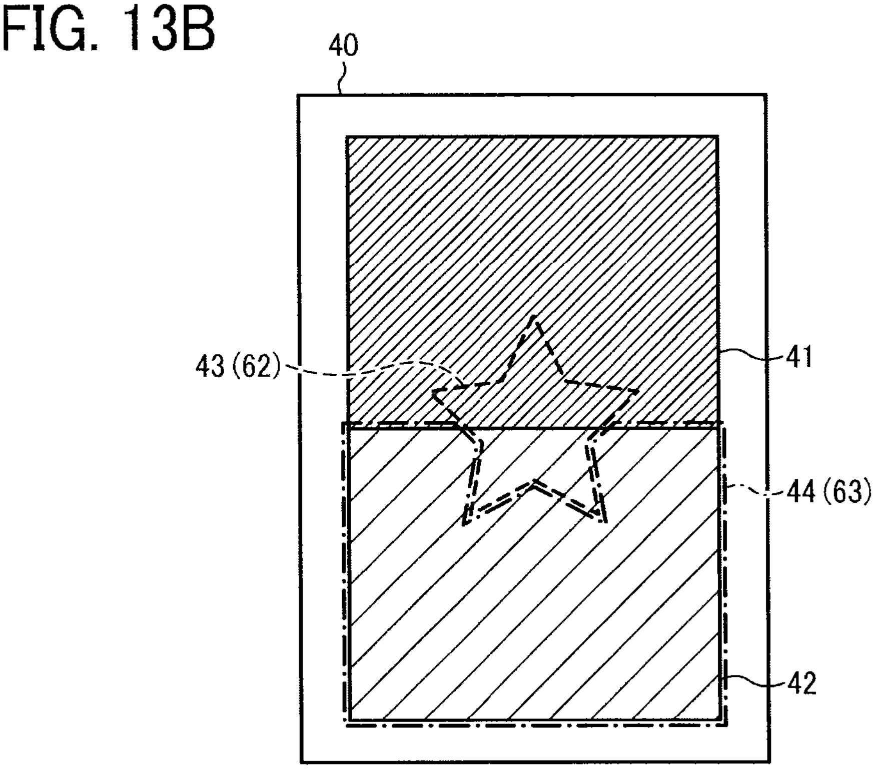
FIG. 13B shows a detail of the image of FIG. 13A.

A description is given of functional configuration of the second example embodiment with reference to FIGS. 12, 4, 5, 13A, 13B, and 8A. FIG. 12 is a functional block diagram of the image forming apparatus 10A. FIG. 4 is an example of a transfer bias management table. FIG. 5 is an example of a heater output management table. FIGS. 13A and 13B show an example of image formable by the image forming apparatus 10A. FIG. 8A shows an example of correlation diagram of secondary transfer bias and secondary transfer ratio.

As for the image forming apparatus 10A, the control unit 170A may include the receiving unit 1701, the colored toner image data generator 1702, the clear toner image data generator 1703, a surface-coating toner image data generator 1704, the computing unit 1706, the total amount correction unit 1707, the transfer bias determination unit 1708, the heater output determination unit 1710, and the writing/reading unit 1720. These units can be devised when each units shown in FIG. 2 is operated by instructions of the CPU 171 by executing programs stored in the ROM 172. Further, the control unit 170A may include the storage unit 1730 configured by, for example, the HD 174 shown in FIG. 2.

(Transfer Bias Management Table)

The storage unit 1730 may configure a transfer bias management database (DB) 1731, which may include a transfer bias management table shown in FIG. 4. The transfer bias management DB 1731 may be referred to as the transfer bias manager. The transfer bias management table stores and manages information of secondary transfer bias variably set in view of total amount of toner deposited at one-pixel area for forming toner images using colored toners, clear toner, and surface-coating toner. Specifically, information of a secondary transfer bias range that can transfer a toner image formed on the intermediate transfer belt 145 to a sheet can be defined by setting a given range for secondary transfer bias such as setting a minimum value and a maximum value for the secondary transfer bias. Such minimum and maximum values vary depending on the total amount of toner to be deposited at each one of unit areas (e.g., pixel) of one target image, which is to be formed as a toner image using colored toners, clear toner, and surface-coating toner. For example, as shown in the transfer bias management table of FIG. 4, a secondary transfer bias range that can transfer a toner image formed by using the total toner amount of 100% is, for example, set from 40 μA (microamperes) to 70 μA.

A description is given of a relationship of a secondary transfer bias and a secondary transfer ratio with reference to FIG. 8A. In FIG. 8A, a profile 51 shows an example of correlation of a secondary transfer bias and a secondary transfer ratio when the image forming apparatus 10 transfers toner images formed by using the lowest total amount (e.g., total amount of 1%), wherein the lowest total amount is the lowest amount of toner that the image forming apparatus 10 can transfer when forming toner images. The secondary transfer ratio is a value obtained by dividing the mass of toner transferred from a transfer belt to a recording medium with the mass of toner adhering on the transfer belt before transferring the toner to the recording medium.

Further, the total amount of toner is an amount of toner used for forming a toner image on each one of unit areas of one target image, to be formed based on image data, in which each toner (e.g., colored toner, clear toner) is used with a specific amount (referred to as sub-amount), and the total amount of toner is obtained by adding the sub-amount of each toner (e.g., colored toner, clear toner) used for a relevant image. The total amount of toner can be computed for each one of unit areas (e.g., pixel) composing one target image. The sub-amount indicates the amount of toner such as mass of toner, volume of toner, amount of toner particles, ratio of toner, or the like used for each unit area (e.g., pixel). The sub-amount may be parameters expressed by such as mass of toner, thickness of toner, volume of toner, types of toner color, and gradient, in which the gradient may be used because the gradient can be computed relatively easily. Such parameters can be correlated with each other. Experiments can be conducted to determine preferable values for such parameters based on measurement results obtained by the experiments, and then, suitable relationship between parameters can be set, and one parameter can be converted another parameter effectively.

In the case of the profile 51, when the secondary transfer bias is lower than a current value 52, charges that can be used for transferring toner become small, and thereby the secondary transfer ratio may not reach a transfer ratio 54, which is a minimum-required level for the transfer process. The transfer ratio 54 is a transfer ratio, which can conduct a transfer process at an acceptable level, which may be determined in view of image forming conditions designed for each apparatus.

In the case of the profile 51, when the secondary transfer bias is greater than the current value 53, charged toner may move to the intermediate transfer belt 145, and thereby the secondary transfer ratio may not reach the transfer ratio 54. Therefore, in the case of the profile 51, a secondary transfer bias range that can effectively transfer toner images is from the current value 52 to the current value 53.

In FIG. 8A, a profile 55 shows an example of correlation of a secondary transfer bias and a secondary transfer ratio, set for transfer process of toner image formed by using a toner-amount control value (e.g., total amount of toner of 260%). The toner-amount control value may be the highest total amount of toner to be deposited at one-pixel area that an image forming operations can be conducted effectively. In the case of the profile 55, a secondary transfer bias range that can effectively transfer toner images is from the current value 53 to the current value 56. Compared to a case in which the total amount of toner is small, when the total amount of toner becomes great, the charge amount held by toner formed on the intermediate transfer belt 145 increases, by which a secondary transfer bias range that can transfer a toner image shifts toward a high current.

As for the image forming apparatus 10A, the default or initial value set for the secondary transfer bias may be set to the current value 53. By setting the current value 53 as the default or initial value set for the secondary transfer bias, the image forming apparatus 10 can transfer toner images with the transfer ratio 54 or more for toner image formed by the lowest total amount (e.g., 1%) to toner image formed by the toner-amount control value (e.g., 260%).

If a secondary transfer bias range that can transfer toner images to sheets changes due to factors such as toner type, sheet type, sheet size, print speed of the image forming apparatus 10A, or the like, the transfer bias management table can be prepared in view of each condition (e.g., sheet type).

(Heater Output Management Table)

The storage unit 1730 may further configure a heater output management database (DB) 1732, which may include a heater output management table shown in FIG. 5. The heater output management DB 1732 may be referred to as the heating amount manager. The heater output management table stores and manages heater output information such as heating amount to be applied for fusing toner images on sheets. Specifically, heater output range (e.g., heating amount) of the heater 151 (i.e., minimum to maximum values), which is a heating amount that can effectively fuse toner images on sheets, can be variably set depending on the total amount of toner to be deposited at each one of unit areas (e.g., pixel) of one target image, which is to be formed as a toner image using colored toners, clear toner, and surface-coating toner. For example, as shown in the heater output management table of FIG. 5, a heater output range (e.g., temperature used for fusing process) that can apply heat amount enabling fusing of a toner image formed by the total amount of 260% to sheets is, for example, from 135 Celsius degrees to 160 Celsius degrees.

The minimum value of heater output is set in view of cold off-set. If the heater output such as heat amount is low, toner may not be effectively melted at a boundary with a sheet, by which a part of toner image may be removed to a fusing roller such as a heat roller during the fusing process (i.e., cold off-set). Therefore, the minimum value of heater output is set to a level that does not cause the cold off-set. Further, the maximum value of heater output is set in view of hot off-set. If the heater output such as heat amount is high, a part of toner image may be removed and adhered to a fusing roller such as a heat roller during the fusing process (i.e., hot off-set). Therefore, the maximum value of heater output is set to a level that does not cause the hot off-set. The greater the total amount of toner, the greater the minimum value and maximum value of heater output because the greater the total amount of toner, the greater the heat amount required to heat toner.

If a secondary transfer bias range that can transfer toner images to sheets changes due to factors such as toner type, sheet type, sheet size, print speed of the image forming apparatus 10A, or the like, the heater output bias management table can be prepared in view of each condition (e.g., sheet type).

The receiving unit 1701 may be devised using the network I/F 177 shown in FIG. 2. The receiving unit 1701 receives various data or information transmitted from an image outputting terminal, device, or apparatus via a communication network. The received data may include image data of image to be formed by the colored toner, and gloss area information indicating a gloss area to be formed by using the clear toner.

The image data may be RGB image data obtained by decomposing an image to, for example, R (Red), G (Green), and B (Blue) image data. In a second example embodiment, as shown in FIGS. 13A and 13B, an image corresponding to the image data may include a high image density area 41 and a low image density area 42. The high image density area 41 may be, for example, a color image area having high image density, and the low image density area 42 may be, for example, a grayscale image area having low image density.

The gloss area information may be positional information indicating an area used for causing a gloss effect in a target image. In the second example embodiment, as shown in FIGS. 13A and 13B, a gloss area 43 indicated in the gloss area information may be formed on or over the high image density area 41 and the low image density area 42. With such a configuration, a watermark can be set by using the effect of gloss level difference between the gloss area 43 and the high image density area 41 and by using the effect of gloss level difference between the gloss area 43 and the low image density area 42. The gloss area 43 can be formed by placing a clear toner on an image (see toner 62 in FIGS. 15 and 16).

The colored toner image data generator 1702 generates image data such as color image data of an image to be formed by the colored toner based on the image data received by the receiving unit 1701, in which the CPU 171 executes a program stored in the ROM 172, and issues an instruction to the colored toner image data generator 1702 to conduct such data generation. For example, based on RGB image data, the colored toner image data generator 1702 generates the color image data (e.g., C, M, Y, K image data) of an image to be formed by, for example, cyan (C), magenta (M), yellow (Y), and black (K) colored toner.

The clear toner image data generator 1703 generates image data (i.e., clear image data) of a clear toner image, to be formed by using the clear toner CL1 (toner CL1) based on the gloss area information received by the receiving unit 1701, in which the CPU 171 executes a program stored in the ROM 172, and issues an instruction to the clear toner image data generator 1703 to conduct such data generation.

The surface-coating toner image data generator 1704 generates image data (i.e., clear image data) of a clear toner image, to be formed by the surface-coating toner CL2 (toner CL2) based on the total amount of toner at a relevant pixel, which may be corrected by the total amount correction unit 1707, in which the CPU 171 executes a program stored in the ROM 172, and issues an instruction to the surface-coating toner image data generator 1704 to conduct such data generation.

Based on the image data of the target image to be formed by each colored toner and clear toner, the computing unit 1706 computes the total amount of toner for each one of unit areas (e.g., pixel) composing the target image, in which the CPU 171 executes a program stored in the ROM 172, and issues an instruction to the computing unit 1706 to conduct such computing.

The computing unit 1706 computes the total amount of toner deposited at each unit area (e.g., pixel), composing the target image, by adding gradient (%) of decomposed color data such as C, M, Y, K image data generated by the colored toner image data generator 1702, and gradient (%) of the clear image data generated by the clear toner image data generator 1703. The unit area may be one pixel, or a given area composed of a plurality of pixels. In the second example embodiment, the unit area may be one-pixel area but not limited to these.

The total amount correction unit 1707 may correct the total amount of toner by increasing an amount of clear toner at a relevant unit area, in which the CPU 171 executes a program stored in the ROM 172, and issues an instruction to the total amount correction unit 1707 to conduct such correction.

The transfer bias determination unit 1708 determines a secondary transfer bias to be applied by the secondary transfer roller 147 of the transfer unit 140 for the secondary transfer process of toner image, in which the CPU 171 executes a program stored in the ROM 172, and issues an instruction to the transfer bias determination unit 1708 to conduct such determination.

The heater output determination unit 1710 sets a heater output of the heater 151 of the fusing unit 150, in which the CPU 171 executes a program stored in the ROM 172, and issues an instruction to the heater output determination unit 1710 to set such heater output.

The writing/reading unit 1720 stores various data to the storage unit 1730, and reads out various data stored in the storage unit 1730 under an instruction of the CPU 171 and the HDD 175 (FIG. 2).

Figure 14:
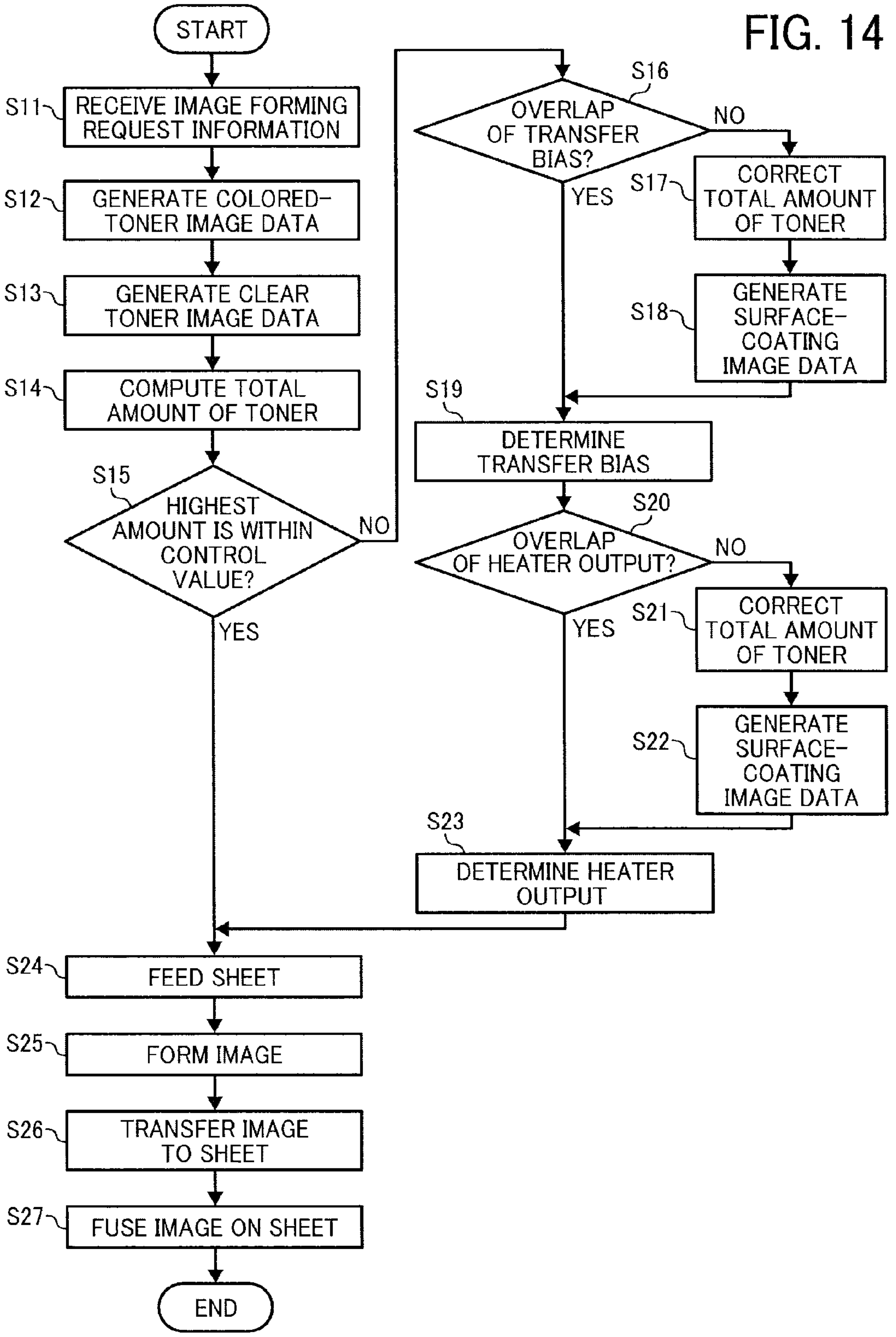
FIG. 14 shows a flowchart of a process executable by the image forming apparatus of FIG. 11.
Figure 15:
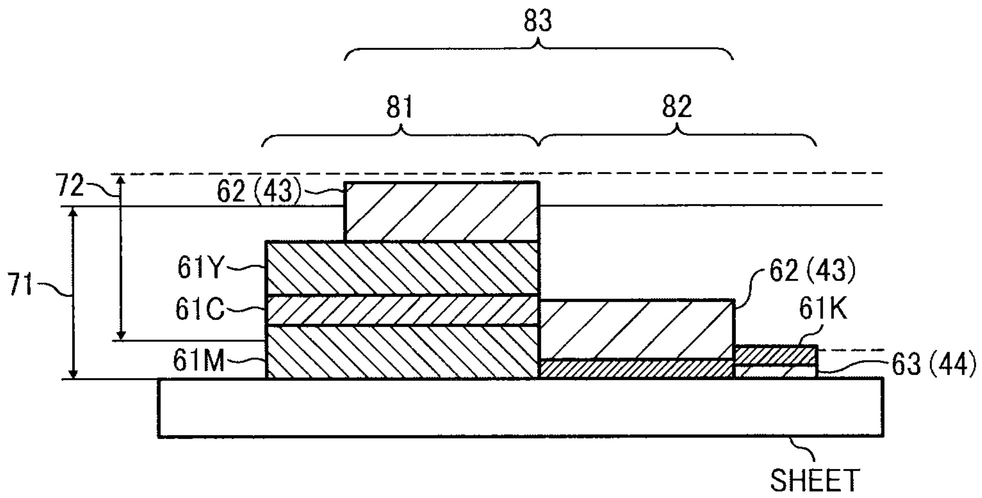
FIG. 15 shows a schematic cross-sectional view of toner images transferred on a sheet with one image forming pattern.
Figure 16:
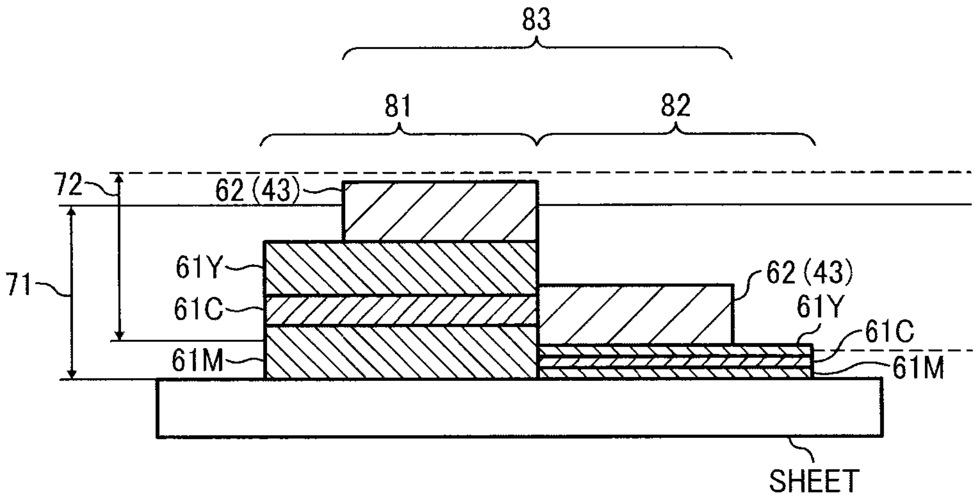
FIG. 16 shows a schematic cross-sectional view of toner images transferred on a sheet with another image forming pattern.

A description is given of a process executable in the image forming apparatus 10A with reference to FIGS. 13A, 13B, 14, 8B, 8C, 15, and 16. FIGS. 13A and 13B show an example of image formed by the image forming apparatus 10A. FIG. 14 shows a flowchart of a process executable in the image forming apparatus 10A. FIGS. 8B and 8C show examples of correlation diagrams of the secondary transfer bias and the secondary transfer ratio. FIGS. 15 and 16 show schematic cross sectional views of toner images transferred on sheets.

As shown in FIG. 14, the receiving unit 1701 of the image forming apparatus 10A receives image forming request information including image data, and gloss area information (step S11). The image data and the gloss area information may be transmitted from an image output terminal such as an information processing apparatus via a communication network. In the second example embodiment, image data may be RGB image data.

When the receiving unit 1701 receives the image forming request information, the colored toner image data generator 1702 generates image data such as C, M, Y, K image data used for forming an image composed of colored toner of cyan (C), magenta (M), yellow (Y), and black (K) based on the RGB image data included in the image forming request information (step S12).

The colored toner image data generator 1702 conducts a color conversion process for the RGB image data corresponding to the high image density area 41 (e.g., color image) and the low image density area 42 (e.g., grayscale image) (FIGS. 13A and 13B), included the image forming request information, and generates C, M, Y, K image data corresponding to the decomposed color data for each colored toner of C, M, Y, and K. Further, other than the color conversion process of image data, the colored toner image data generator 1702 can conduct image processing such as a color correction process, a space frequency correction process, or the like.

In contrast, the clear toner image data generator 1703 generates image data (i.e., clear image data) used for forming an image of clear toner (CL1) based on the gloss area information included in the image forming request information (step S13). In the second example embodiment, the clear toner image data generator 1703 generates the clear image data corresponding to the gloss area 43 to be set on the high image density area 41 and the low image density area 42 as shown in FIGS. 13A and 13B.

Then, the computing unit 1706 computes the total amount of toner to be deposited for each one of unit areas (e.g., each pixel) composing a target image when a toner image is to be formed by colored toner such as cyan (C), magenta (M), yellow (Y), and black (K), and clear toner (CL) (step S14), wherein the clear toner CL such as CL1 and CL2 may be used as required. The computing unit 1706 computes the total amount of toner to be used for forming a toner image for each one of unit areas (e.g., pixel) by adding gradient (%) of decomposed color data such as C, M, Y, K image data generated by the colored toner image data generator 1702, and gradient (%) of the clear image data generated by the clear toner image data generator 1703.

As such, at step S14, in view of the to-be-formed toner image, the computing unit 1706 computes the total amount of toner to be deposited at each pixel, which are unit areas of the target image. Such toner image may be composed of different patterns such as an image area (e.g., photo, picture, graph), a text area (e.g., letter), a background area (e.g., background pattern, sheet face), or the like. Therefore, each one of the pixels may be deposited with different amount of toner. For example, in one target image composed of multiple pixels, one pixel may be deposited with small amount of toner, and another pixel may be deposited with large amount of toner. In such target image, at least one pixel may be deposited with lowest amount of toner (i.e., lowest total amount of toner) compared to other pixels, and at least one pixel may be deposited with highest amount of toner (i.e., highest total amount of toner) compared to other pixels. Based on such computed result, step S15 is conducted as follows. It should be noted that a total amount of toner to be deposited per unit area of a target image, to be formed based on image data, can be computed as follows: a first unit area is computed to form a first toner image using a highest total amount of toner, and a second unit area is computed to form a second toner image using a lowest total amount of toner. As such, a toner image of target image may be composed of a plurality of toner images using different total amount of toner per unit area.

The total amount correction unit 1707 determines whether the highest total amount of toner to be disposed at one pixel, computed by the computing unit 1706, is within a given level such as the toner-amount control value (step S15). The ROM 172 of the image forming apparatus 10A may store the toner-amount control value. With such a configuration, the total amount correction unit 1707 can determine whether the highest total amount of toner is within the toner-amount control value by referencing the toner-amount control value stored in the ROM 172.

If it is determined that the highest total amount of toner is not within the toner-amount control value (step S15: NO), the total amount correction unit 1707 determines whether a secondary transfer bias range that can transfer a toner image having the highest total amount of toner, computed by the computing unit 1706, and a secondary transfer bias range that can transfer a toner image having the lowest total amount of toner, computed by the computing unit 1706, overlap with each other (step S16).

At step S16, the total amount correction unit 1707 searches the transfer bias management table (FIG. 4) using the computed lowest total amount of toner as a search key, and obtains a maximum transfer bias corresponding to the computed lowest total amount of toner. For example, if the computed lowest total amount of toner is 100%, the corresponding maximum transfer bias becomes 70 μA to (FIG. 4). Further, the total amount correction unit 1707 searches the transfer bias management table (FIG. 4) using the computed highest total amount of toner as a search key, and obtains a minimum transfer bias corresponding to the computed highest total amount of toner. For example, if the computed highest total amount of toner is 200%, the corresponding minimum transfer bias becomes 60 μA (FIG. 4).

When the maximum transfer bias corresponding to the lowest total amount of toner is same or greater than the minimum transfer bias corresponding to the highest total amount of toner, the total amount correction unit 1707 determines that two secondary transfer bias profiles have an overlapping portion with each other in view of the effective secondary transfer ratio (e.g., profiles 59 and 60 of FIG. 8B).

When the maximum transfer bias corresponding to the lowest total amount of toner is smaller than the minimum transfer bias corresponding to the highest total amount of toner in view of the effective secondary transfer ratio, the total amount correction unit 1707 determines that the two secondary transfer bias profiles do not have an overlapping portion with each other (e.g., profiles 50 and 60 of FIG. 8C).

If it is determined that the two secondary transfer bias profiles do not have an overlapping portion with each other (step S16: NO), the total amount correction unit 1707 corrects the total amount of toner by increasing an amount of surface-coating toner at a relevant pixel (step S17). At step S17, the total amount correction unit 1707 corrects the total amount of toner at the relevant pixel to a value so that a transfer bias range that can transfer a toner image formed by the lowest total amount (i.e., corrected lowest total amount of toner) of toner at one-pixel area, and a transfer bias range that can transfer a toner image formed by the highest total amount of toner at one-pixel area overlap with each other in view of the effective secondary transfer ratio.

The total amount correction unit 1707 searches the transfer bias management table (FIG. 4) using the computed highest total amount (e.g., P in FIG. 8C) of toner as the search key, and obtains a minimum transfer bias (e.g., X in FIG. 8C) corresponding to the computed highest total amount (P). Then, the total amount correction unit 1707 searches a total amount of toner having a maximum transfer bias (e.g., Yin FIG. 8C) greater than the obtained minimum transfer bias (X) by referencing the transfer bias management table (FIG. 4). Specifically, the total amount of toner having the maximum transfer bias greater than the obtained minimum transfer bias (X) may be set for a plurality of levels in the transfer bias management table. From the plurality of levels of the total amount of toner, the total amount correction unit 1707 searches a lowest total amount of toner (e.g., Q in FIG. 8C) having a maximum transfer bias (Y) greater than the obtained minimum transfer bias (X) by referencing the transfer bias management table.

Further, in the image data used for an image forming operation, an image data having a total amount of toner (e.g., R in FIG. 8C), which is smaller than the obtained total amount of toner (Q), may exist. The surface-coating toner image data generator 1704 corrects the image data having the total amount of toner (R) by increasing an amount of surface-coating toner for the relevant pixel. Specifically, the total amount correction unit 1707 corrects the total amount of toner (R) to the total amount of toner (Q) for the relevant pixel so that the total amount of toner (R) becomes the total amount of toner (Q) (e.g., profile 50 for R and profile 61 for Q in FIG. 8C).

Based on the corrected total amount of toner (Q), the surface-coating image data is generated (step S18). The generated surface-coating image data is transmitted to the image forming unit 130, and used to prepare a surface-coating area 44 formed by the surface-coating toner (FIG. 13B). The surface-coating area 44 can be formed by placing a clear toner on a recording sheet such as paper (see toner 63 in FIG. 15), and the surface-coating area 44 becomes a bottom layer of the target or main image as shown in FIG. 15.

If it is determined that two secondary transfer bias profiles have an overlapping portion with each other in view of the effective secondary transfer ratio (step S16: YES), or the total amount correction is conducted (step S17), the transfer bias determination unit 1708 determines the secondary transfer bias (step S19). With such a configuration, the default or initial value set for the secondary transfer bias can be corrected to a new secondary transfer bias.

The transfer bias determination unit 1708 refers to the transfer bias management table (FIG. 4), and as shown in FIG. 8B for example, determines the secondary transfer bias in a range from the transfer bias 57 (i.e., minimum transfer bias for the highest total amount of toner) to the transfer bias 58 (i.e., maximum transfer bias for the lowest total amount of toner). Further, when the total amount correction (step S17) is conducted, the maximum transfer bias for the lowest total amount of toner, corresponding to the corrected toner amount used for forming the relevant image, becomes the maximum transfer bias (e.g., 58 in FIG. 8C) for the lowest total amount of toner (Q) which is set by conducting the total amount correction.

After conducting the transfer bias determination process (step S19), the total amount correction unit 1707 determines a heater output of the heater 151 (step S20). Specifically, the total amount correction unit 1707 determines whether a heater output range of the heater 151 that can fuse a toner image formed by the highest total amount of toner, computed by the computing unit 1706, and a heater output range of the heater 151 that can fuse a toner image formed by the lowest total amount of toner, computed by the computing unit 1706, overlap with each other (step S20).

When the total amount correction is conducted (step S17), the lowest total amount of toner used at step S20 means the lowest total amount of toner, corrected by the transfer bias determination process.

In this situation, the total amount correction unit 1707 searches the heater output management table (FIG. 5) using the lowest total amount of toner as a search key, and obtains a maximum heater output corresponding to the lowest total amount of toner.

Further, the total amount correction unit 1707 searches the heater output management table (FIG. 5) using the computed highest total amount of toner as a search key, and obtains a minimum heater output corresponding to the highest total amount of toner.

When the maximum heater output corresponding to the lowest total amount of toner is same or greater than the minimum heater output corresponding to the highest total amount of toner, the total amount correction unit 1707 determines that the two profiles of heater output overlaps with each other.

When the maximum heater output corresponding to the lowest total amount of toner is smaller than the minimum heater output corresponding to the highest total amount of toner, the total amount correction unit 1707 determines that the two profiles of heater output do not have an overlapping portion with each other.

If it is determined that the two profiles of heater output do not overlap each other (step S20: NO), the total amount correction unit 1707 corrects the total amount of toner by increasing an amount of surface-coating toner at a relevant pixel (step S21). At step S21, the total amount correction unit 1707 corrects the total amount of toner at the relevant pixel to a value so that a heater output range that can fuse a toner image formed by the lowest total amount of toner at one-pixel area, and a heater output range that can fuse a toner image formed by the highest total amount of toner at one-pixel area overlap with each other.

The total amount correction unit 1707 searches the heater output management table (FIG. 5) using the computed highest total amount of toner as a search key, and obtains a minimum heater output (C). Then, the total amount correction unit 1707 searches a total amount of toner having a maximum heater output greater than the obtained minimum heater output (C) by referencing the heater output management table. Specifically, the total amount of toner having the heater output greater than the obtained minimum heater output may be set for a plurality of levels in the heater output management table. From the plurality of levels of the total amount of toner, the total amount correction unit 1707 searches the lowest total amount of toner having a maximum heater output greater than the obtained minimum heater output by referencing the heater output management table.

Further, in the image data used for an image forming operation, an image data having a total amount of toner, which is smaller than the obtained total amount of toner, may exist. The surface-coating toner image data generator 1704 corrects the image data having such smaller total amount of toner by increasing an amount of surface-coating toner for the relevant pixel (step S22). Specifically, the total amount correction unit 1707 corrects such smaller total amount of toner to the corrected total amount of toner for the relevant pixel so that the lowest total amount of toner becomes the corrected total amount of toner.

Based on the corrected total amount of toner, the surface-coating image data is generated (step S22). The generated surface-coating image data is transmitted to the image forming unit 130, and used to form a surface-coating area 44 using the surface-coating toner (see FIG. 13B). The surface-coating area 44 can be formed by placing a clear toner on a recording sheet such as paper (see toner 63 in FIG. 15), and the surface-coating area 44 becomes a bottom layer of the target or main image as shown in FIG. 15.

If it is determined that the two heater output profiles overlap with each other (step S20: YES), or the total amount correction is conducted (step S21), the heater output determination unit 1710 determines the heater output of the heater 151 (step S23). With such a configuration, the default or initial value of the heater output of the heater 151 can be corrected to a new heater output determined by the heater output determination process.

In this situation, the heater output determination unit 1710 searches the heater output management table (FIG. 5), and determines a heater output of the heater 151 in a range from the minimum heater output for the highest total amount of toner to the maximum heater output corresponding to the lowest total amount of toner. When the total amount correction (steps S17, S21) is conducted, the maximum heater output corresponding to the lowest total amount of toner means a maximum heater output corresponding to the lowest total amount of toner after conducting the total amount correction.

If it is determined that the highest total amount of toner is within the toner-amount control value (step S15: YES), or the heater output adjustment process is executed (step S23), the sheet feed roller 112 of the sheet feed unit 110 feeds the sheets contained in the sheet container 111 one by one to a transport route in the image forming apparatus 10 (step S24). Then, the transport roller 121 of the transport unit 120 transports the sheet to the transfer unit 140. The timing roller 122 sandwiches the front edge of the sheet transported by the transport roller 121, and stops the sheet until a transfer timing of image to the sheet at the transfer unit 140.

The image forming devices of the image forming unit 130 form toner images composed of toner images of C, M, Y, K, CL1, CL2 based on the generated color image data, and clear image data (step S25), in which the charger 132 uniformly charges the surface of the photoconductor drum 131 rotating in the counter-clockwise direction.

The exposure 133 irradiates a light beam onto the charged surface of the photoconductor drum 133 charged by the charger 132 based on each image data to form a latent image. The exposure 133*a* emits a laser beam onto the charged surface of the photoconductor drum 133*a* based on the clear image data. With such a configuration, an electrostatic latent image corresponding to the clear image data is formed on the charged photoconductor drum 131*a*.

Similarly, each of the exposures 133*b*, 133*c*, 133*d*, 133*e* emits a laser beam onto the charged surface of the photoconductor drums 131*b*, 131*c*, 131*d*, 131*e* based on color image data such as decomposed color data included in C, M, Y, K image data. With such a configuration, electrostatic latent images corresponding to each of the decomposed color data of Y, C, M, K is formed on the each of the charged photoconductor drums 131*b*, 131*c*, 131*d*, 131*e*, respectively.

Further, the exposure 133*f* emits a laser beam onto the charged surface of the photoconductor drum 133*f* based on the surface-coating image data. With such a configuration, an electrostatic latent image corresponding to the surface-coating image data is formed on the charged photoconductor drum 131*f*.

When each electrostatic latent image is formed, the development unit 134 develops the electrostatic latent image on the photoconductor drums 131*a*, 131*b*, 131*c*, 131*d*, 131*e*, 131*f* using toner of CL1, Y, C, M, K, CL2 to form toner images of CL1, Y, C, M, K, CL2.

The developed toner images are sequentially and superimposingly transferred onto the intermediate transfer belt 145 traveling in the clockwise direction in FIG. 1 by applying a primary transfer voltage using the primary transfer roller 146 (primary transfer process).

A description is given of toner images transferred on a sheet with reference to FIG. 15. As shown in FIG. 15, a toner image 81 is formed by yellow toner (toner 61Y), cyan toner (toner 61C), and magenta toner (toner 61M) on a sheet, wherein the toner image 81 corresponds to the high image density area 41 of FIG. 13B. Further, as shown in FIG. 15, clear toner 62 is placed on the toner image 81 to form a toner image 83, which corresponds to the gloss area 43 of FIG. 13B. In FIG. 15, the toner image 81 is, for example, composed of the toner 61Y, toner 61C, and toner 61M, and the toner image 83 is, for example, composed of the toner 61Y, toner 61C, toner 61M, and clear toner 62.

Further, as shown in FIG. 15, the surface-coating toner 63 is placed on a sheet as a bottom layer of a toner image 82, wherein the surface-coating toner 63 corresponds to the surface-coating area 44 (FIGS. 13B and 15). Further, as shown in FIG. 15, a toner image formed by using black toner (toner 61K) may be formed on or over the surface-coating toner 63 (i.e., surface-coating area 44), by which the toner image 82 corresponding to the low image density area 42 (FIG. 13B) is formed.

As shown in FIG. 15, the clear toner 62 is formed on the toner image 81 corresponding to the high image density area 41 (FIG. 13B) and on the toner image 82 corresponding to the low image density area 42 (FIG. 13B) to form the toner image 83, which can be observed as the gloss area 43.

After the primary transfer of toner images to the intermediate transfer belt 145, the surface of the photoconductor drum 131 is neutralized by the decharger 135. Further, toner remaining on the neutralized surface of the photoconductor drum 131 is removed by the cleaner 136.

The toner image transferred and adhered to the intermediate transfer belt 145 travels with the intermediate transfer belt 145. When the determined secondary transfer bias is applied by the secondary transfer roller 147, the toner image is transferred to a sheet (step S26), which is the secondary transfer process.

When the transfer bias determination process is conducted, the secondary transfer bias determined by the transfer bias determination unit 1708 (step S19) is used as the secondary transfer bias. Further, the sheet to be transferred with the toner image can be fed by the timing roller 122 at a timing that the toner image on the intermediate transfer belt 145 comes to the nip of secondary transfer process.

In the second example embodiment, as shown in FIG. 15, a toner image, formed by depositing toner particles up to a designed toner amount range 71, corresponding to the toner-amount control value, can be formed effectively by using the default or initial value set for the secondary transfer bias. However, as shown in FIG. 15, a part of the toner image 83 exceeds the designed toner amount range 71. Therefore, if a secondary transfer process for the toner image 83 is conducted using the default or initial value set for the secondary transfer bias, charges that can be used for the transfer process of toner becomes relatively small, and thereby a transfer failure may occur at an area of the toner image 83. Such unpreferable transfer phenomenon may correspond to the relation of the profiles 60 and 50 in FIG. 8C, in which the profiles 60 and 50 have no overlapping portion or range for the effective transfer process.

In such a situation, the total amount correction unit 1707 corrects the total amount of toner for the low image density area 42 by increasing an amount of the clear toner 63 such as surface coating toner used for the low image density area 42. Further, the transfer bias determination unit 1708 determines the secondary transfer bias in a range from the minimum transfer bias (e.g., 57 in FIG. 8C) corresponding to the highest total amount of toner to the maximum transfer bias (e.g., 58 in FIG. 8C corresponding to the lowest total amount of toner (step S19).

With such a configuration, the lowest total amount of toner for the relevant pixel is increased, and thereby the amount difference between the lowest total amount of toner for the relevant pixel and the highest total amount of toner for another relevant pixel can be shifted to an adjusted toner amount range 72 (FIG. 9), in which the maximum amount of toner can be maintained at high, which may be required to form an image having a given color tone. With such adjustment, the toner image 81, the toner image 82, and the toner image 83 can be effectively transferred by the determined secondary transfer bias.

The sheet having received the secondary transfer processing is then transported to the fusing unit 150. The sheet transported to the fusing unit 150 is heated and pressurized by the heat roller 152 and the pressure roller 153 when the sheet passes a nip set between the heat roller 152 and the pressure roller 153 (step S27). When the heater output adjustment process is executed, the heater output of the heater 151 of the heat roller 152 is set to a heater output determined by the heater output determination unit 1710 (step S23). When the heater output adjustment process is not conducted, the heater output of the heater 151 is set to the default or initial value of heater output.

With such a configuration, toner of CL1, C, M, Y, K, CL2 transferred to the sheet can be plasticized or melted. Further, by applying pressure to the melted toner and sheet by the pressure roller 153, the toner can be closely adhered to the sheet, and toner may intrude to fibers of sheet, by which the toner fuses on the sheet. Because the heater output adjustment process is executed (step S23), the cold off-set may not occur to the toner image 82 having a small total amount of toner, and the hot off-set may not occur to the toner image 83 having a great total amount of toner.

Then, the sheet is ejected by the ejection roller 123 from the transport route in the image forming apparatus 10A, and stacked on a given receiver container such as a tray.

(Another Processing for Second Example Embodiment)

In the above described configuration, the total amount correction unit 1707 of the control unit 170A of the image forming apparatus 10A corrects the total amount of toner by increasing an amount of surface-coating toner. However, the correction of the total amount of toner is not limited the above described method. For example, the total amount correction unit 1707 can correct the total amount of toner for the relevant pixel by increasing the numbers or types of colored toner.

For example, the total amount correction unit 1707 instructs the colored toner image data generator 1702 to convert RGB image data for the low image density area 42 (e.g., grayscale image) to C, M, Y image data corresponding to toner 61C, 61M, 61Y instead of K image data corresponding to toner 61K. As such, black image data can be prepared using C, M, Y image data.

In such a case, the amount of toner 61C, 61M, 61Y of the toner image 82 (FIG. 16) formed at the low image density area 42 (e.g., grayscale image) becomes great compared to the amount of toner 61K forming a black image (FIG. 15) using only single color (i.e., black only). FIG. 16 shows another schematic cross sectional view of toner images transferred on a sheet, in which the toner 61C, 61M, 61Y form a black image as the toner image 82. With such a configuration, the correction amount corrected by the surface-coating toner can be reduced (FIG. 16), and thereby the change of gloss level of the toner image 82 due to the toner amount correction can be reduced.

In the above described second example embodiment, the ROM 172 of the control unit 170 of the image forming apparatus 10A may store programs used for image forming apparatus. However, programs can be stored differently. For example, an image output terminal used as one example of image forming apparatuses may include a storage unit to store image forming programs, which are programs used for image forming apparatus. With such a configuration, a part or entire of functions of the control unit 170 may be devised by the image output terminal.

In such a case, the image output terminal can transmit image data having corrected total amount of toner, transfer bias information indicating the secondary transfer bias, information of the heater output of the heater 151 to the image forming apparatus 10A. Further, the image forming apparatus 10A can form images based on the transmitted data and information.

In the above described second example embodiment, the heating amount can be defined by the heater output of the heater 151 such as specific temperature set for the fusing process. However, the heating amount indicating a heating level can be defined differently. For example, instead of the temperature information set for the heater 151, the heating time by the heater 151 can be used as the heating amount.

(Effect of Second Example Embodiment)

In the second example embodiment, the total amount correction unit 1707 can correct the total amount of toner deposited at the relevant unit area by increasing the amount of the surface-coating toner, which is placed as a bottom layer of a target image when printed on a sheet. With such a configuration, the total amount of toner at the relevant unit area can be corrected while preventing a change of color tone of the target or main image.

Further, in the second example embodiment, the total amount correction unit 1707 can correct the total amount of toner deposited at the relevant unit area by increasing the numbers or types of colored toner. For example, the total amount correction unit 1707 instructs the colored toner image data generator 1702 to convert RGB image data for the low image density area 42 (e.g., grayscale image) to C, M, Y image data corresponding to toner 61C, 61M, 61Y instead of K image data corresponding to toner 61K. In such a case, the amount of toner (61C, 61M, 61Y) of the toner image 82 (FIG. 16) formed at the low image density area 42 (e.g., grayscale image) becomes great compared to the amount of toner 61K forming a black image (FIG. 15) using only single color (i.e., black only). With such a configuration, the amount of the surface-coating toner used for the toner amount correction can be reduced, and thereby the change of gloss level of the toner image 82 due to the toner amount correction can be reduced (FIG. 16).

As above described, in an image forming apparatus according to the present invention, when the highest total amount of toner to be disposed at one unit area (e.g., one pixel) for one image exceeds a given level, the image forming apparatus can conduct the above described processing to determine an overlapping portion or range of a transfer bias range that can transfer the highest total amount of toner, and a transfer bias range that can transfer the lowest total amount of toner, in which two transfer bias profiles that can overlap can be determined. With such a configuration, even when the highest total amount of toner to be disposed at one unit area (e.g., one pixel) exceeds the given level, the toner image can be effectively transferred using such determined transfer bias while not reducing the toner amount for the target or main image, by which the decrease of image density of the target or main image can be prevented.

The present invention can be implemented in any convenient form, for example using dedicated hardware, or a mixture of dedicated hardware and software. The present invention may be implemented as computer software implemented by one or more networked processing apparatuses. The network can comprise any conventional terrestrial or wireless communications network, such as the Internet. The processing apparatuses can compromise any suitably programmed apparatuses such as a general purpose computer, personal digital assistant, mobile telephone (such as a Wireless Application Protocol (WAP) or 3G-compliant phone) and so on. Since the present invention can be implemented as software, each and every aspect of the present invention thus encompasses computer software implementable on a programmable device.

The computer software can be provided to the programmable device using any storage medium or carrier medium for storing processor readable code such as a flexible disk, a compact disk read only memory (CD-ROM), a digital versatile disk read only memory (DVD-ROM), DVD recording only/rewritable (DVD-R/RW), electrically erasable and programmable read only memory (EEPROM), erasable programmable read only memory (EPROM), a memory card or stick such as USB memory, a memory chip, a mini disk (MD), a magneto optical disc (MO), magnetic tape, a hard disk in a server, a solid state memory device or the like, but not limited these.

The hardware platform includes any desired kind of hardware resources including, for example, a central processing unit (CPU), a random access memory (RAM), and a hard disk drive (HDD). The CPU may be implemented by any desired kind of any desired number of processor. The RAM may be implemented by any desired kind of volatile or non-volatile memory. The HDD may be implemented by any desired kind of non-volatile memory capable of storing a large amount of data. The hardware resources may additionally include an input device, an output device, or a network device, depending on the type of the apparatus. Alternatively, the HDD may be provided outside of the apparatus as long as the HDD is accessible. In this example, the CPU, such as a cache memory of the CPU, and the RAM may function as a physical memory or a primary memory of the apparatus, while the HDD may function as a secondary memory of the apparatus.

In the above-described example embodiment, a computer can be used with a computer-readable program, described by object-oriented programming languages such as C++, Java (registered trademark), JavaScript (registered trademark), Perl, Ruby, or legacy programming languages such as machine language, assembler language to control functional units used for the apparatus or system. For example, a particular computer (e.g., personal computer, work station) may control an information processing apparatus or an image processing apparatus such as image forming apparatus using a computer-readable program, which can execute the above-described processes or steps. In the above described embodiments, at least one or more of the units of apparatus can be implemented in hardware or as a combination of hardware/software combination. In example embodiment, processing units, computing units, or controllers can be configured with using various types of processors, circuits, or the like such as a programmed processor, a circuit, an application specific integrated circuit (ASIC), used singly or in combination.

Numerous additional modifications and variations are possible in light of the above teachings. It is therefore to be understood that within the scope of the appended claims, the disclosure of the present invention may be practiced otherwise than as specifically described herein. For example, elements and/or features of different examples and illustrative embodiments may be combined each other and/or substituted for each other within the scope of this disclosure and appended claims.

What is claimed is:

1. An image forming apparatus, comprising:

a computing unit, using a processor, to compute a total amount of toner to be deposited per unit area of a target image to be formed based on image data, in which a first unit area is computed to form a first toner image using a highest total amount of toner, and a second unit area is computed to form a second toner image using a lowest total amount of toner;

a transfer bias determination unit that, using the processor, determines, when the highest total amount of toner computed by the computing unit exceeds a given level, whether a first transfer bias range enabling transfer of the computed highest total amount of toner and a second transfer bias range enabling transfer of the computed lowest total amount of toner have an overlapping portion that can effectively transfer the first toner image, and the second toner image;

the transfer bias determination unit determining a transfer bias to transfer a toner image of the target image from the overlapping portion that can effectively transfer the first toner image, and the second toner image;

an image forming unit to form the toner image of the target image on a transfer member by forming the first toner image, and the second toner image on the transfer member;

a transfer unit to transfer the toner image of target image, formed on the transfer member, to a recording medium using the transfer bias determined by the transfer bias determination unit; and a fusing unit to fuse the toner image of target image, transferred by the transfer unit, on the recording medium.

2. The image forming apparatus of claim 1, further comprising a total amount correction unit that, using the processor, corrects an amount of the lowest total amount of toner by increasing an amount of the lowest total amount of toner when the first transfer bias range and the second transfer bias range do not have an overlapping portion, wherein the lowest total amount of toner is increased to an amount so that the first transfer bias range and a corrected second transfer bias corresponding to the corrected lowest total amount of toner have an overlapping portion, wherein the transfer bias determination unit identifies a transfer bias for transferring the toner image of target image from an overlapping portion of the first transfer bias range and the corrected second transfer bias, wherein the image forming unit forms the toner image of target image in view of the corrected lowest total amount of toner, corrected by the total amount correction unit.

3. The image forming apparatus of claim 2, wherein the toner includes a colored toner and a clear toner, wherein the total amount correction unit increases the amount of clear toner to increase the total amount of toner at the second unit area, computed as the lowest total amount of toner.

4. The image forming apparatus of claim 3, wherein the image forming unit forms the toner image of target image on the transfer member, the image forming unit sequentially forms a toner image of the clear toner on the transfer member, and a toner image of the colored toner on the toner image of the clear toner.

5. The image forming apparatus of claim 2, wherein the toner includes a colored toner, a clear toner, and a surface-coating toner, wherein the total amount correction unit increases the amount of surface-coating toner to increase the total amount of toner at the second unit area, computed as the lowest total amount of toner.

6. The image forming apparatus of claim 5, wherein when the image forming unit forms the toner image of the target image on the transfer member, the image forming unit sequentially forms a toner image of the clear toner, a toner image of the colored toner on the toner image of the clear toner, and a toner image of the surface-coating toner on the toner image of the colored toner.

7. The image forming apparatus of claim 3, wherein the colored toner includes a plurality of colored toners, wherein the total amount correction unit increases the colored toner amount of the plurality of colored toners to increase a total amount of toner at the second unit area, computed as the lowest total amount of toner.

8. The image forming apparatus of claim 1, further comprising a heater output determination unit that, using the processor, determines whether a heating amount range to fuse the computed highest total amount of toner computed by the computing unit and a heating amount range to fuse the computed the lowest total amount of toner have an overlapping portion that can effectively fuse the toner image of the target image, wherein the heater output determination unit identifies a heating amount for fusing the toner image of the target image from the overlapping portion that can effectively fuse the toner image of the target image;

wherein the fusing unit fuses the toner image of the target image, transferred by the transfer unit, on the recording medium using the heating amount determined by the heater output determination unit.

9. The image forming apparatus of claim 1, further comprising:

a transfer bias manager to manage total amount information indicating a total amount of toner and transfer bias information indicating a range of transfer bias to transfer the total amount of toner by correlating the total amount information and the transfer range information, wherein when the highest total amount of toner computed by the computing step exceeds a given level, the transfer bias determination unit obtains transfer bias information corresponding to the computed highest total amount of toner from the transfer bias manager, and transfer bias information corresponding to the computed lowest total amount of toner from the transfer bias manager; and the transfer bias determination unit determines a transfer bias used for transferring the toner image of the target image from an overlapping portion of the transfer bias information corresponding to the computed highest total amount of toner, and the transfer bias information corresponding to the computed lowest total amount of tone.

10. The image forming method of claim 8, further comprising:

a heating amount manager to manage total amount information indicating a total amount of toner and heating amount information indicating a heating amount range to heat the total amount of toner by correlating the total amount information and the heating amount range;

wherein the heater output determination unit obtains heating amount information correlated to the computed highest total amount of toner from the heating amount manager, and heating amount information correlated to the computed lowest total amount of toner from the heating amount manager; and wherein the heater output determination unit identifies a heating amount for fusing the toner image of the target image from an overlapping portion of the heating amount information correlated to the computed highest total amount of toner, and the heating amount information correlated to the computed lowest total amount of toner.

11. An image forming method comprising the steps of:

computing a total amount of toner to be deposited per unit area of a target image to be formed based on image data, in which a first unit area is computed to form a first toner image using a highest total amount of toner, and a second unit area is computed to form a second toner image using a lowest total amount of toner;

when the highest total amount of toner computed by the computing step exceeds a given level, determining whether a first transfer bias range enabling transfer of the computed highest total amount of toner, and a second transfer bias range enabling transfer of the computed lowest total amount of toner have an overlapping portion that can effectively transfer the first toner image, and the second toner image;

identifying a transfer bias to transfer a toner image of the target image from the overlapping portion that can effectively transfer the first toner image, and the second toner image;

forming the toner image of the target image on a transfer member by forming the first toner image, and the second toner image on the transfer member;

transferring the toner image of target image, formed on the transfer member, to a recording medium using the determined transfer bias; and fusing the toner image of target image, transferred by the transfer step, on the recording medium.

12. The image forming method of claim 11, further comprising:

managing a transfer bias using a transfer bias manager to manage total amount information indicating a total amount of toner, and transfer bias information indicating a range of transfer bias to transfer the total amount of toner by correlating the total amount information and the transfer range information;

when the highest total amount of toner computed by the computing step exceeds a given level, obtaining transfer bias information corresponding to the computed highest total amount of toner from the transfer bias manager, and transfer bias information corresponding to the computed lowest total amount of toner from the transfer bias manager; and identifying a transfer bias for transferring the toner image of the target image from an overlapping portion of the transfer bias information corresponding to the computed highest total amount of toner, and the transfer bias information corresponding to the computed lowest total amount of tone.

13. The image forming method of claim 11, further comprising:

managing a heating amount using a heating amount manager to manage total amount information indicating a total amount of toner, and heating amount information indicating a heating amount range to heat the total amount of toner by correlating the total amount information and the heating amount range;

obtaining heating amount information correlated to the computed highest total amount of toner from the heating amount manager, and heating amount information correlated to the computed lowest total amount of toner from the heating amount manager; and identifying a heating amount for fusing the toner image of the target image from an overlapping portion of the heating amount information correlated to the computed highest total amount of toner, and the heating amount information correlated to the computed lowest total amount of toner.

14. A non-transitory computer readable storage medium storing a program that, when executed by a computer, causes the computer to execute a method of image forming processing in an image forming apparatus, the method comprising:

computing a total amount of toner to be deposited per unit area of a target image to be formed based on image data, in which a first unit area is computed to form a first toner image using a highest total amount of toner, and a second unit area is computed to form a second toner image using a lowest total amount of toner;

when the highest total amount of toner computed by the computing step exceeds a given level, determining whether a first transfer bias range enabling transfer of the computed highest total amount of toner, and a second transfer bias range enabling transfer of the computed lowest total amount of toner have an overlapping portion that can effectively transfer the first toner image, and the second toner image;

identifying a transfer bias to transfer a toner image of the target image from the overlapping portion that can effectively transfer the first toner image, and the second toner image;

forming the toner image of the target image on a transfer member by forming the first toner image, and the second toner image on the transfer member;

transferring the toner image of target image, formed on the transfer member, to a recording medium using the determined transfer bias; and fusing the toner image of target image, transferred by the transfer step, on the recording medium.

15. The non-transitory computer readable storage medium of claim 14, further comprising:

managing a transfer bias using a transfer bias manager to manage total amount information indicating a total amount of toner, and transfer bias information indicating a range of transfer bias to transfer the total amount of toner by correlating the total amount information and the transfer range information;

when the highest total amount of toner computed by the computing step exceeds a given level, obtaining transfer bias information corresponding to the computed highest total amount of toner from the transfer bias manager, and transfer bias information corresponding to the computed lowest total amount of toner from the transfer bias manager; and identifying a transfer bias for transferring the toner image of the target image from an overlapping portion of the transfer bias information corresponding to the computed highest total amount of toner, and the transfer bias information corresponding to the computed lowest total amount of tone.

16. The non-transitory computer readable storage medium of claim 14, the method further comprising:

managing a heating amount using a heating amount manager to manage total amount information indicating a total amount of toner, and heating amount information indicating a heating amount range to heat the total amount of toner by correlating the total amount information and the heating amount range;

obtaining heating amount information correlated to the computed highest total amount of toner from the heating amount manager, and heating amount information correlated to the computed lowest total amount of toner from the heating amount manager; and identifying a heating amount for fusing the toner image of the target image from an overlapping portion of the heating amount information correlated to the computed highest total amount of toner, and the heating amount information correlated to the computed lowest total amount of toner.

* * * * *